(12) United States Patent
Ma et al.

(10) Patent No.: US 12,439,788 B2
(45) Date of Patent: Oct. 7, 2025

(54) DISPLAY PANEL AND DEVICE WITH OPTICAL COMPONENT REGION PIXEL DRIVING CIRCUITS OUTSIDE THE OPTICAL COMPONENT REGION

(71) Applicant: Wuhan Tianma Micro-Electronics Co., Ltd., Wuhan (CN)

(72) Inventors: Yangzhao Ma, Wuhan (CN); Hao Dai, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 18/690,784

(22) PCT Filed: Oct. 13, 2022

(86) PCT No.: PCT/CN2022/125058
§ 371 (c)(1),
(2) Date: Mar. 11, 2024

(87) PCT Pub. No.: WO2024/011776
PCT Pub. Date: Jan. 18, 2024

(65) Prior Publication Data
US 2025/0143110 A1  May 1, 2025

(30) Foreign Application Priority Data

Jul. 13, 2022 (CN) .......................... 202210824328.X

(51) Int. Cl.
*H10K 59/13* (2023.01)
*G09G 3/3233* (2016.01)
(Continued)

(52) U.S. Cl.
CPC ......... *H10K 59/131* (2023.02); *G09G 3/3233* (2013.01); *H10K 59/121* (2023.02);
(Continued)

(58) Field of Classification Search
CPC .................. G09G 3/3233; G09G 3/32; G09G 2300/0412; G09G 2330/08; H10K 59/131; H10K 59/121
See application file for complete search history.

(56) References Cited

U.S. PATENT DOCUMENTS

2021/0191552 A1   6/2021  Bok
2023/0354658 A1*  11/2023 You ..................... H10K 59/1213
(Continued)

FOREIGN PATENT DOCUMENTS

| CN | 111834425 A | 10/2020 |
| CN | 111916486 A | 11/2020 |

(Continued)

OTHER PUBLICATIONS

International Search Report and Written Opinion for Application No. PCT/CN2022/125058 dated Feb. 7, 2023.

*Primary Examiner* — Liliana Cerullo
(74) *Attorney, Agent, or Firm* — KDW FIRM PLLC

(57) ABSTRACT

Provided are a display panel and a display device. The display panel includes a display region and light-emitting elements. The display region includes a first display region and an optical component region. The light-emitting elements include first light-emitting elements and second light-emitting elements, where the first light-emitting elements are located in the first display region, and the second light-emitting elements are located in the optical component region. The first display region includes multiple pixel drive unit columns arranged along a first direction, the multiple pixel drive unit columns include a first pixel drive unit column, the first pixel drive unit column includes multiple first pixel driving circuits, and one of the multiple first pixel driving circuits is electrically connected to one of the second light-emitting elements.

20 Claims, 19 Drawing Sheets

(51) Int. Cl.
*H10K 59/121* (2023.01)
*H10K 59/131* (2023.01)
*G09G 3/32* (2016.01)

(52) U.S. Cl.
CPC ....... *G09G 3/32* (2013.01); *G09G 2300/0413* (2013.01); *G09G 2300/0842* (2013.01); *G09G 2300/0861* (2013.01); *G09G 2330/08* (2013.01)

(56) References Cited

U.S. PATENT DOCUMENTS

2024/0324372 A1* 9/2024 Zhang ................... H10K 59/65
2024/0381708 A1* 11/2024 Chen ................. H10K 59/1213

FOREIGN PATENT DOCUMENTS

| | | |
|---|---|---|
| CN | 113410269 A | 9/2021 |
| CN | 113707092 A | 11/2021 |
| CN | 113745274 A | 12/2021 |
| CN | 113936604 A | 1/2022 |
| CN | 114141851 A | 3/2022 |
| CN | 216623636 U | 5/2022 |
| CN | 114639328 A | 6/2022 |
| CN | 114649394 A | 6/2022 |
| CN | 114725173 A | 7/2022 |
| CN | 115346486 A | 11/2022 |

* cited by examiner

DISPLAY PANEL AND DEVICE WITH OPTICAL COMPONENT REGION PIXEL DRIVING CIRCUITS OUTSIDE THE OPTICAL COMPONENT REGION

CROSS-REFERENCE TO RELATED APPLICATIONS

This is a National Stage Application filed under 35 U.S.C. 371 based on International Patent Application No. PCT/CN2022/125058, filed on Oct. 13, 2022, which claims priority to Chinese Patent Application No. 202210824328.X filed on Jul. 13, 2022, disclosures of both of which are incorporated herein by reference in their entireties.

TECHNICAL FIELD

The present application relates to the field of display technologies, for example, a display panel and a display device.

BACKGROUND

The space often needs to be reserved for commonly used electronic photosensitive devices such as front-facing cameras, infrared sensors, and fingerprint recognition devices on the front side of a mobile phone, a tablet computer, and other display devices. For example, these photosensitive devices are disposed at the top of the front of the display device, forming a non-display region at the corresponding position, resulting in a reduction in the screen-to-body ratio of the device.

With the development of display technologies, a display panel has a higher and higher screen-to-body ratio, and the full screen attracts widespread attention due to the narrow-frame or even frameless display effect. In the related art, to increase the screen-to-body ratio, an optical component region may be provided in a display region of the display panel to accommodate the preceding photosensitive devices. For example, the optical component region is provided in the display region of a display screen, and a camera is under the screen and correspondingly disposed in the optical component region. During normal display, the optical component region can play a display role; during taking pictures or videos, the camera takes photos or videos through the optical component region so that the optical component region can simultaneously implement the functions of display and shooting. At present, how to improve the light transmittance of the optical component region and the overall display effect of the display panel becomes one of the research trends.

SUMMARY

The present application provides a display panel and a display device, aiming at improving the light transmittance and photosensitive performance of the product in an optical component region and improving the overall display quality of the product.

The present application provides a display panel. The display panel includes a display region and light-emitting elements.

The display region includes a first display region and an optical component region.

The light-emitting elements include first light-emitting elements and second light-emitting elements, where the first light-emitting elements are located in the first display region, and the second light-emitting elements are located in the optical component region.

The first display region includes multiple pixel drive unit columns arranged along a first direction, the multiple pixel drive unit columns include a first pixel drive unit column, the first pixel drive unit column includes multiple first pixel driving circuits, and one of the multiple first pixel driving circuits is electrically connected to one of second light-emitting elements.

The present application provides a display device. The display device includes the preceding display panel.

DETAILED DESCRIPTION

Figure 1:
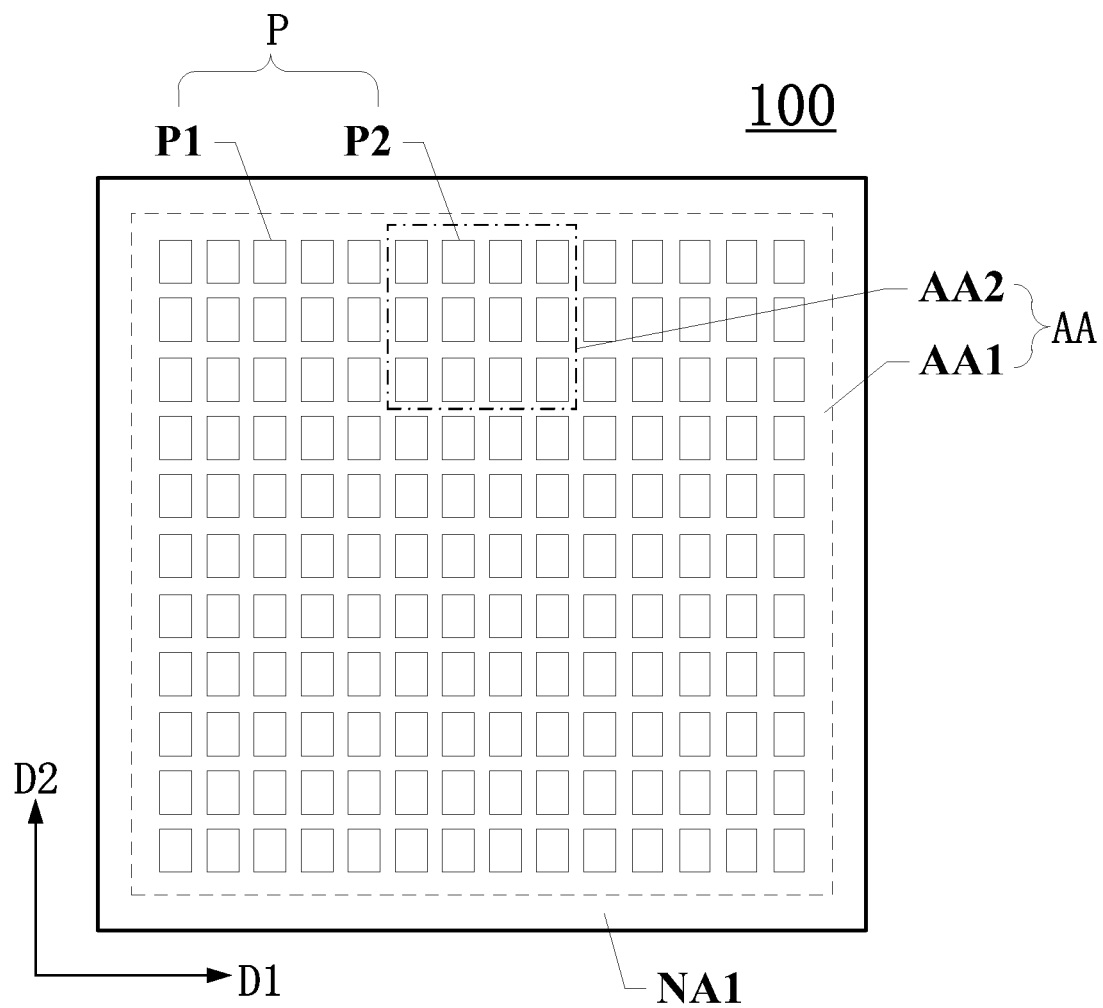
FIG. 1 is a structural diagram of a display panel according to an embodiment of the present application.

Various example embodiments of the present application are described with reference to the drawings. Relative arrangements of components and steps, numerical expressions, and numerical values set forth in these embodiments do not limit the scope of the present application.

The following description of at least one example embodiment is merely illustrative in nature.

Techniques, methods, and devices known to those of ordinary skill in the related art may not be discussed, but where appropriate, such techniques, methods, and devices should be considered part of the specification.

In all examples shown and discussed herein, any values should be construed as merely exemplary. Therefore, other examples of the example embodiments may have different values.

Similar reference numerals and letters indicate similar items in the following drawings, so once a particular item is defined in a drawing, the item does not need to be further discussed in the subsequent drawings.

In the related art, when an optical component region is provided in a display region of a display panel to accommodate photosensitive devices such as cameras, infrared sensors, and fingerprint recognition devices to improve the screen-to-body ratio of the display panel and implement the narrow-frame or frameless display effect, light-emitting elements and corresponding pixel driving circuits are generally introduced into the optical component region, and in a display stage, the pixel driving circuits in the optical component region are used for driving the light-emitting elements in the optical component region to emit light. However, since the pixel driving circuit generally includes electronic components such as transistors, when the pixel driving circuits are disposed in the optical component region, the light transmittance of the optical component region is greatly affected and the photosensitive performance of the optical component region is affected.

The present application provides a display panel. The display panel includes a display region and light-emitting elements. The display region includes a first display region and an optical component region. The light-emitting elements include first light-emitting elements and second light-emitting elements, where the first light-emitting elements are located in the first display region, and the second light-emitting elements are located in the optical component region. The first display region includes multiple (two or more) pixel drive unit columns arranged along a first direction, the multiple pixel drive unit columns include a first pixel drive unit column, the first pixel drive unit column includes multiple (two or more) first pixel driving circuits, and one of the multiple first pixel driving circuits is electrically connected to one of the second light-emitting elements. The first pixel driving circuits connected to the second light-emitting elements of the optical component region are disposed in the first display region, avoiding occupying the space of the optical component region and effectively improving the light transmittance of the optical component region, which is conducive to improving the photosensitive performance of the optical component region. In addition, the electrical connection between the first pixel driving circuits and the second light-emitting elements is also conducive to improving the performance of driving the second light-emitting elements, improving the display effect of the optical component region in the display stage, and further improving the overall display quality of the display panel and the display device.

The technical solutions in the embodiments of the present application are described below in conjunction with the drawings in the embodiments of the present application.

Figure 2:
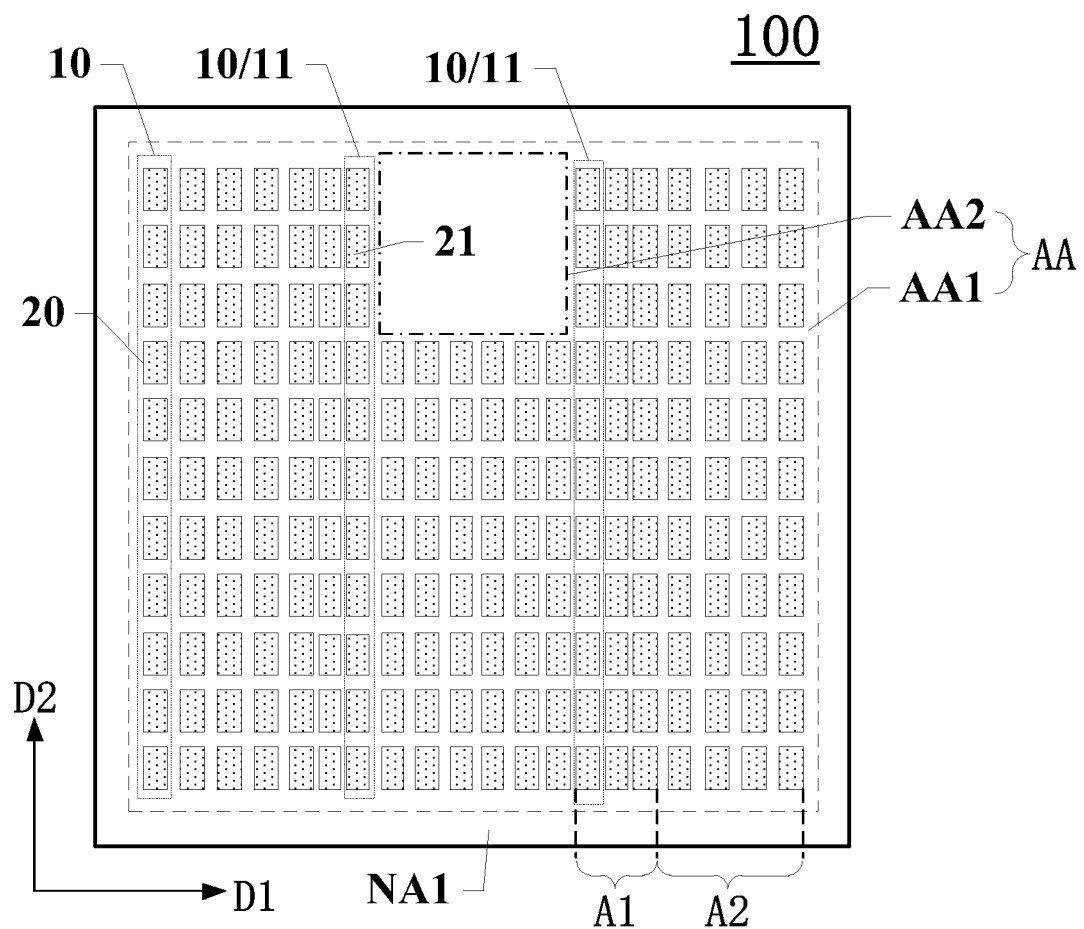
FIG. 2 is a schematic diagram illustrating the arrangement of pixel driving circuits in a display panel according to an embodiment of the present application.
Figure 3:
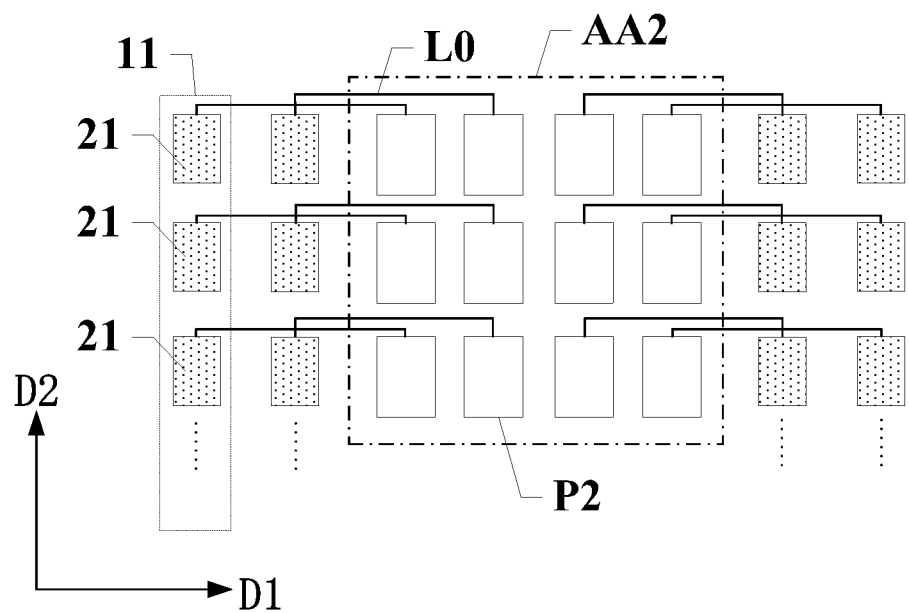
FIG. 3 is a schematic diagram illustrating the connection between second light-emitting elements in an optical component region and first pixel driving circuits in a first display region in a display panel according to an embodiment of the present application.

FIG. 1 is a structural diagram of a display panel according to an embodiment of the present application. FIG. 1 is a schematic diagram illustrating the arrangement of first light-emitting elements P1 and second light-emitting elements P2 on a display panel 100 and does not show the corresponding pixel driving circuits. FIG. 2 is a schematic diagram illustrating the arrangement of pixel driving circuits in a display panel according to an embodiment of the present application. To illustrate the arrangement of pixel driving circuits 20, the first light-emitting elements P1 and the second light-emitting elements P2 are not shown in FIG. 2. FIG. 3 is a schematic diagram illustrating the connection between second light-emitting elements in an optical component region and first pixel driving circuits in a first display region in a display panel according to an embodiment of the present application. To reflect the connection relationship between the second light-emitting elements and the first pixel driving circuits, the first light-emitting elements P1 and other pixel driving circuits in a first display region AA1 are not shown in FIG. 3.

In conjunction with FIGS. 1 to 3, this embodiment provides the display panel 100. The display panel 100 includes a display region AA and light-emitting elements P.

The display region AA includes the first display region AA1 and an optical component region AA2. The light-emitting elements P include the first light-emitting elements P1 and the second light-emitting elements P2, where the first light-emitting elements P1 are located in the first display region AA1, and the second light-emitting elements P2 are located in the optical component region AA2. The first display region AA1 includes multiple (two or more) pixel drive unit columns 10 arranged along a first direction D1, the pixel drive unit columns 10 include a first pixel drive unit column 11, the first pixel drive unit column 11 includes multiple (two or more) first pixel driving circuits 21, and one first pixel driving circuit 21 is electrically connected to one second light-emitting element P2.

In the display panel 100 provided in the embodiment of the present application, the first display region AA1 and the optical component region AA2 are provided. In an embodiment, the first display region AA1 at least partially surrounds the optical component region AA2. In FIGS. 1 and 2, the case where the first display region AA1 half surrounds the optical component region AA2 is used as an example for description. Electronic photosensitive devices such as cameras, infrared sensors, and fingerprint recognition devices are disposed in the optical component region AA2. The first light-emitting elements P1 are disposed in the first display region AA1, and the second light-emitting elements P2 are disposed in the optical component region AA2. In the display stage, both the optical component region AA2 and the first display region AA1 implement a display function, and the second light-emitting elements P2 of the optical component region AA2 are driven by the first pixel driving circuits 21 to emit light; in a photosensitive stage, the optical component region AA2 is used as a light-transmissive region to implement a photosensitive function, and the second light-emitting elements P2 of the optical component region AA2 may not emit light at this time. For example, when the camera is disposed in the optical component region AA2, in the photosensitive stage, the optical component region AA2 is used as the light-transmissive region to implement a function of taking pictures. In this embodiment, the optical component region AA2 is integrated into the display region AA, which is conducive to reducing the space of the non-display region of the display panel 100 and achieving a narrow-frame or frameless design of the display panel 100.

In the present application, the first pixel driving circuits 21 configured to drive the second light-emitting elements P2 of the optical component region AA2 to emit light are disposed in the first pixel drive unit column 11 in the first display region AA1, and the first pixel driving circuits 21 are not disposed in the optical component region AA2, so as to avoid the influence of the first pixel driving circuits on the light transmittance of the optical component region AA2, which is conducive to improving the photosensitive performance of the optical component region AA2 in the photosensitive stage. In addition, for the second light-emitting elements P2 in the optical component region AA2 and the first pixel driving circuits 21 in the first display region AA1, one first pixel driving circuit 21 drives one second light-emitting element P2 to emit light. Compared with the solution in the related art that one pixel driving circuit drives two or more second light-emitting elements to emit light, the present application is more conducive to improving the display effect of the optical component region AA2 in the display stage, reducing the display brightness difference between the optical component region AA2 and the first display region AA1, improving the overall display effect of the display panel 100 and the display device, and improving the display quality.

Figure 4:
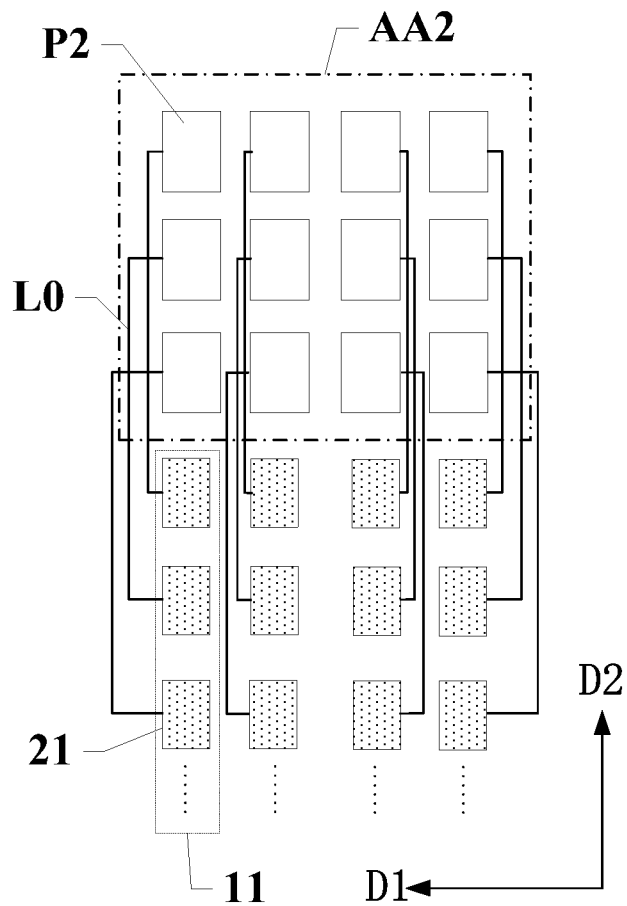
FIG. 4 is a schematic diagram illustrating the connection between second light-emitting elements in an optical component region and first pixel driving circuits in a first display region in another display panel according to an embodiment of the present application.

FIG. 2 only illustrates one position situation of the first pixel drive unit columns 11, that is, only shows the solution in which the first pixel drive unit columns 11 are located on two sides of the optical component region AA2 along the first direction D1. In some other embodiments of the present application, the first pixel drive unit columns 11 may be located on at least one side of the optical component region AA2 along a second direction D2, which is not limited in the present application. For example, referring to FIG. 4, FIG. 4 is a schematic diagram illustrating the connection between second light-emitting elements in an optical component region and first pixel driving circuits in a first display region in another display panel according to an embodiment of the present application. In this embodiment, the first pixel drive unit column 11 where the first pixel driving circuits 21 are located is located on a side of the optical component region AA2 along the second direction.

In this embodiment, the first pixel drive unit column 11 includes multiple (two or more) first pixel driving circuits 21. For example, referring to FIG. 3, a feasible implementation is that the first pixel drive unit column 11 includes only the first pixel driving circuits 21. Another feasible implementation is that, in addition to the first pixel driving circuits 21, the first pixel drive unit column 11 may further include other pixel driving circuits, such as the pixel driving circuits not connected to the second light-emitting elements P2, which is described in the subsequent embodiments.

The display panel 100 provided in this embodiment may be a display panel using organic light-emitting diode (OLED) display technologies, that is, an OLED display panel. The basic structure of the OLED display panel generally includes an anode, a light-emitting layer, and a cathode. When a power supply supplies a proper voltage, the holes in the anode and the electrons in the cathode combine in the light-emitting layer to produce bright light. Compared with thin-film field-effect transistor liquid crystal displays, OLED display devices have the characteristics of high visibility and high brightness and are more power-saving, lighter in weight, and thinner in thickness. In some other embodiments of the present application, the display panel 100 may be a display panel using inorganic light-emitting diode display technologies, such as a micro light-emitting element (microLED) display panel or a mini light-emitting diode (mini LED) display panel.

Figure 5:
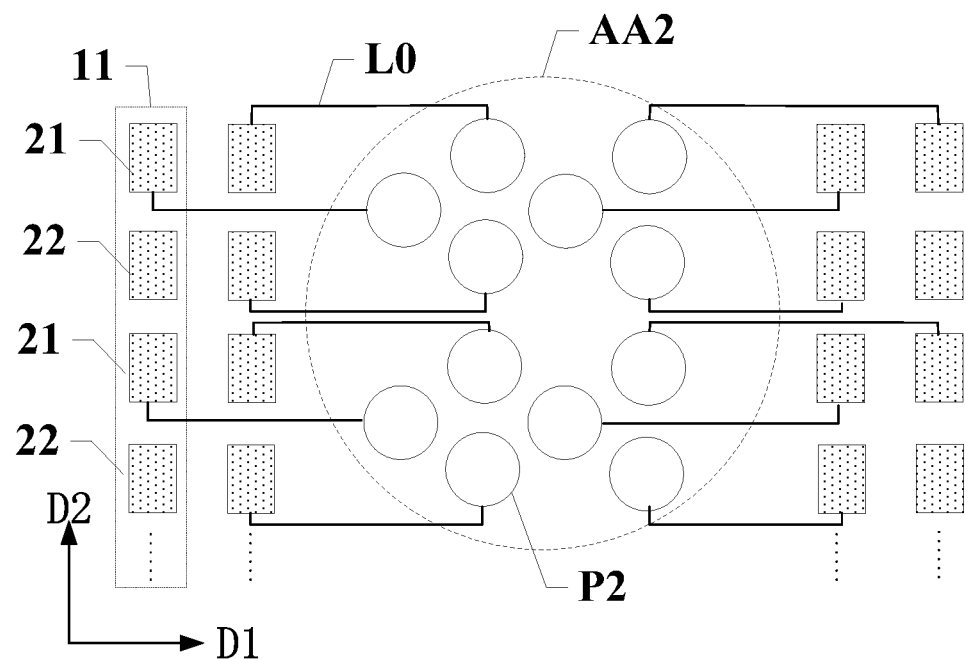
FIG. 5 is a schematic diagram illustrating the connection between second light-emitting elements in an optical component region and first pixel driving circuits in a first display region in another display panel according to an embodiment of the present application.

FIGS. 1 and 2 only show the case where the display panel 100 includes one optical component region AA2. In some other embodiments of the present application, two or more optical component regions AA2 may be provided on the display panel 100, which is not limited in the present application. Only the case where the display panel 100 includes one optical component region AA2 is used as an example for the description below. When the display panel 100 includes multiple (two or more) optical component regions AA2, reference may be made to the embodiments of the present application for execution. FIGS. 1 and 2 only show the case where the first display region AA1 half surrounds the optical component region AA2. In some other embodiments of the present application, the first display region AA1 may fully surround the optical component region AA2. FIGS. 1 and 2 only show a relative positional relationship between the first display region AA1 and the optical component region AA2 in the display panel 100. In some other embodiments of the present application, the optical component region AA2 may be located at other positions in the display panel 100, which is not limited in the present application. In addition, the case where the shape of the optical component region AA2 in FIGS. 1 to 3 is a rectangle is only for illustration. In some other embodiments of the present application, the optical component region AA2 may be embodied in other shapes such as a circle or an ellipse, and the dimension of the optical component region AA2 may be set according to actual requirements, which is not limited in the present application. In addition, FIG. 1 only shows a schematic arrangement of pixels in the first display region AA1 and the optical component region AA2. For example, referring to FIG. 5, the case where the optical component region AA2 has a circular structure is used as an example for description in FIG. 5, and the shape of the light-emitting elements included in the optical component region AA2 is also circular. Correspondingly, the shape of the light-emitting elements in the first display region AA1 may be configured to be the same as or different from the shape of the light-emitting elements in the optical component region AA2, which is not limited in the present application. FIG. 5 is a schematic diagram illustrating the connection between second light-emitting elements in an optical component region and first pixel driving circuits in a first display region in another display panel according to an embodiment of the present application.

In addition, FIG. 1 and FIG. 2 only show the case where the display panel 100 is rectangular to illustrate the shape of the display panel 100 of the present application and do not limit the actual shape of the display panel 100. In some other embodiments of the present application, the shape of the display panel may be embodied in other shapes, such as a circle, an ellipse, a non-rectangular shape, and other special-shaped structures.

In this embodiment, only the case where the connection lead L0 between the first pixel driving circuit 21 and the second light-emitting element P2 is a straight line is used as an example for description. In some other embodiments of the present application, to avoid the diffraction phenomenon of the optical component region AA2, the connection lead L0 of the optical component region AA2 may be configured to be a curve. In addition, to improve the light transmittance of the optical component region AA2, the connecting lead L0 of the optical component region AA2 may be configured to be a transparent lead.

Figure 6:
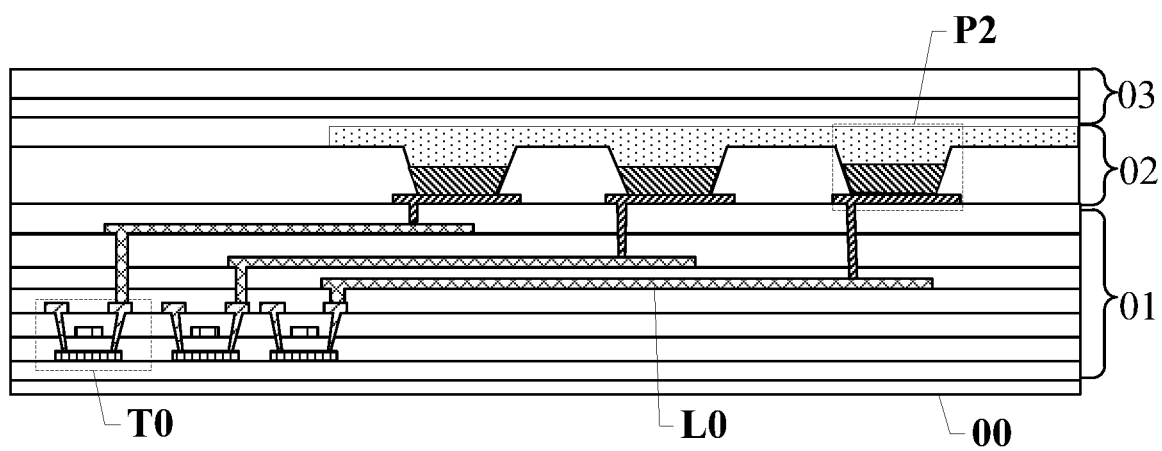
FIG. 6 is a schematic diagram illustrating films of a display panel according to an embodiment of the present application.

FIG. 6 is a schematic diagram illustrating films of a display panel according to an embodiment of the present application. This embodiment shows a schematic diagram of the film distribution of the connection lead of the optical component region AA2. Referring to FIG. 6, the display panel 100 provided in the embodiment of the present application includes a substrate 00, an array layer 01 disposed on the substrate 00, a light-emitting element layer 02 disposed on a side of the array layer 01 facing away from the substrate 00, and an encapsulation layer 03 disposed on a side of the light-emitting element layer 02 facing away from the substrate 00. This embodiment shows a schematic diagram illustrating films of the connection lead L0 configured to connect the second light-emitting element P2 to the first pixel driving circuit 21 (only the drive transistor T0 in the pixel driving circuit is shown in FIG. 6). In this embodiment, the connection leads L0 are disposed in three different films, which is conducive to avoiding the following: when the connection leads L0 are disposed in the same layer, the space is insufficient and the light transmittance of the optical device region is affected. The embodiment in FIG. 6 is only for illustration. In some other embodiments of the present application, the connection leads L0 of the optical component region AA2 may be disposed in two different films or in more than three different films, which is not limited in the present application.

With continued reference to FIGS. 1, 2, 5, and 7, FIG. 7 is a schematic diagram illustrating the connection between second light-emitting elements in an optical component region and first pixel driving circuits in a first display region in another display panel according to an embodiment of the present application. In an embodiment of the present application, the first pixel drive unit column 11 further includes multiple (two or more) first dummy pixel driving circuits 22.

The dummy pixel driving circuits mentioned in the embodiment of the present application refer to the pixel driving circuits not connected to the light-emitting elements under normal circumstances; in other words, under normal circumstances, the dummy pixel driving circuits do not implement the function of driving the light-emitting elements to emit light. In an embodiment, the structure of the dummy pixel driving circuits is the same or substantially the same as the structure of the pixel driving circuits capable of driving the light-emitting elements to emit light in the display panel 100. In an embodiment, the first dummy pixel driving circuits 22 are reused as repairing pixel driving circuits, that is, when the pixel driving circuits corresponding to the first light-emitting elements P1 and/or the second light-emitting elements P2 are in an abnormal working state, the first dummy pixel driving circuits 22 are configured to work instead.

In the embodiment of the present application, the first pixel drive unit column 11 is introduced in the first display region AA1, and the first pixel driving circuits 21 in the first pixel drive unit column 11 drive the second light-emitting elements P2 in the optical component region AA2 to emit light. In addition, the first dummy pixel driving circuits 22 may also be introduced into the first pixel drive unit column 11. In addition to the first pixel drive unit column 11, the pixel drive unit columns 10 in the embodiment of the present application further include other pixel drive unit columns, and at least part of the pixel driving circuits in the other pixel drive unit columns are configured to drive the first light-emitting elements P1 in the first display region AA1 to emit light. When the display panel 100 is provided with multiple (two or more) pixel drive unit columns 10, in the actual production process, the multiple (two or more) pixel drive unit columns 10 may be manufactured using the same manufacturing process. Moreover, when the first dummy pixel driving circuits 22 are retained in the first pixel drive unit column 11, after the complete first pixel drive unit column 11 is manufactured, the unnecessary pixel driving circuits do not need to be removed but are used as the first dummy pixel driving circuits 22, which is conducive to simplifying the manufacturing process of the display panel 100 and improving the production efficiency of the display panel 100. In an embodiment, the first pixel drive unit column 11 further includes third pixel driving circuits, where the third pixel driving circuits are electrically connected to the first light-emitting elements P1.

Referring to FIG. 5, in an example of the present application, in the first pixel drive unit column 11, the first pixel driving circuits 21 and the first dummy pixel driving circuits 22 are arranged alternately.

In the first pixel drive unit column 11, the first pixel driving circuits 21 are the pixel driving circuits electrically connected to the second light-emitting elements P2 in the optical component region AA2, and the first dummy pixel driving circuits 22 are the pixel driving circuits not connected to any light-emitting element. In the first pixel drive unit column 11 shown by the dotted frame in the embodiment shown in FIG. 5, the first pixel driving circuits 21 and the first dummy pixel driving circuits 22 are arranged alternately, that is to say, the pixel driving circuits electrically connected to the light-emitting elements P2 and the pixel driving circuits not electrically connected to the second light-emitting elements P2 are arranged alternately. In practical application, according to the pixel arrangement structure of the optical component region AA2 and the positional relationship between the pixels and the pixel driving circuits in the first pixel drive unit column 11, the pixel driving circuits that are convenient for wiring are selected from the first pixel drive unit column 11 as the first pixel driving circuits 21 connected to the second light-emitting elements P2, and the remaining pixel driving circuits not connected to the second light-emitting elements P2 are used as the first dummy pixel driving circuits 22, thereby simplifying the connection complexity between the first pixel driving circuits 21 and the second light-emitting elements P2.

In the first pixel drive unit column 11 in the embodiment shown in FIG. 5, only the alternate arrangement of the first pixel driving circuits 21 and the first dummy pixel driving circuits 22 is limited, and the first pixel driving circuits 21 and the first dummy pixel driving circuits 22 are not limited in sequence. In some other embodiments of the present application, the pixel driving circuit located at the top of the first pixel drive unit column 11 may be the first dummy pixel driving circuit 22. FIG. 5 only shows one manner in which one first pixel driving circuit 21 and one first dummy pixel driving circuit 22 are arranged alternately. In some other embodiments of the present application, multiple first pixel driving circuits 21 and one first dummy pixel driving circuit 22 are arranged alternately, one first pixel driving circuit 21 and multiple first dummy pixel driving circuits 22 are arranged alternately, or multiple first pixel driving circuits 21 and multiple first dummy pixel driving circuits 22 are arranged alternately, which is not limited in the embodiment of the present application.

Figure 7:
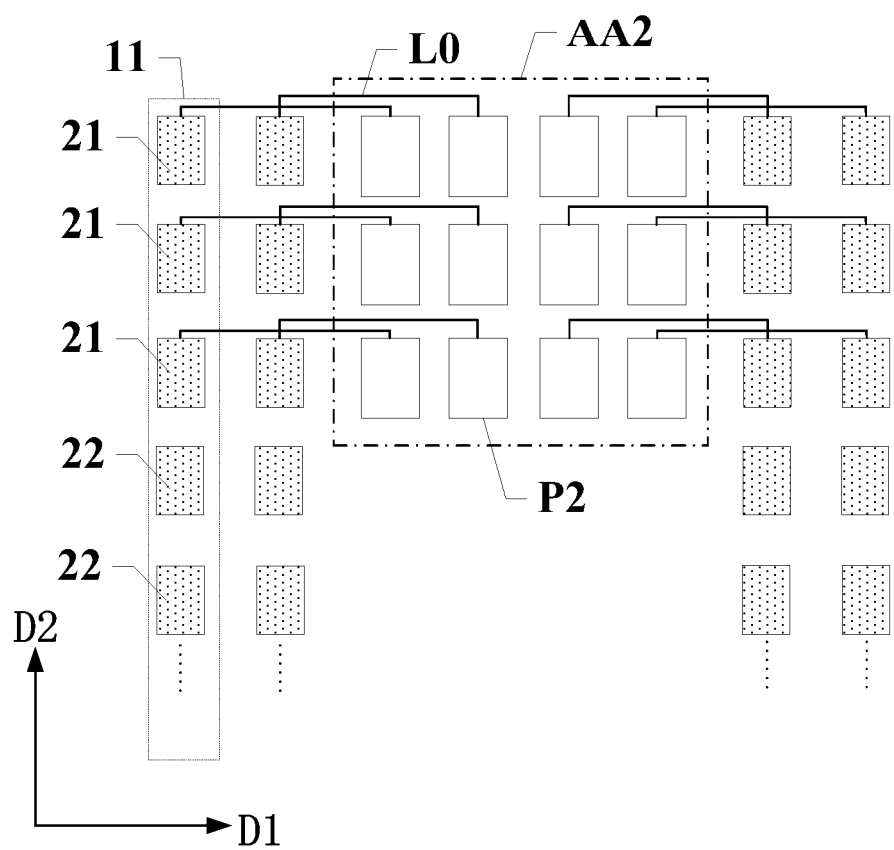
FIG. 7 is a schematic diagram illustrating the connection between second light-emitting elements in an optical component region and first pixel driving circuits in a first display region in another display panel according to an embodiment of the present application.

Referring to FIG. 7, in an example of the present application, in the first pixel drive unit column 11, the first pixel driving circuits 21 and the first dummy pixel driving circuits 22 are concentrated separately.

In the first pixel drive unit column 11, the first pixel driving circuits 21 are the pixel driving circuits electrically connected to the second light-emitting elements P2 in the optical component region AA2, and the first dummy pixel driving circuits 22 are the pixel driving circuits not connected to any light-emitting element. In the first pixel drive unit column 11 shown by the dotted frame in the embodiment shown in FIG. 7, the first pixel driving circuits 21 electrically connected to the second light-emitting elements P2 are adjacent to each other, and in other words, no first dummy pixel driving circuit 22 is provided between two adjacent first pixel driving circuits 21; the first dummy pixel driving circuits 22 not electrically connected to the second light-emitting elements P2 are adjacent to each other, and in other words, no first pixel driving circuit 21 is provided between two adjacent first dummy pixel driving circuits 22. In an embodiment, multiple (two or more) pixel driving circuits that are adjacent to the optical component region AA2 and in the first pixel drive unit column 11 are used as the first pixel driving circuits 21, and the remaining pixel driving circuits are used as the first dummy pixel driving circuits 22, and the first pixel driving circuits 21 and the first dummy pixel driving circuits 22 are equivalent to being concentrated separately so that the length of the connection lead between the first pixel driving circuit 21 and the second light-emitting element P2 that are connected is reduced, which is conducive to simplifying the wiring complexity and improving the production efficiency of the display panel 100.

The second light-emitting elements P2 included in the optical component region AA2 and the connection relationship between the second light-emitting elements P2 and the first pixel driving circuits 21 in the embodiment shown in FIGS. 3 to 5 and FIG. 7 are only for illustration, and the quantity, shape, and arrangement structure of the second light-emitting elements P2 actually included in the optical component region AA2 are limited.

Figure 8:
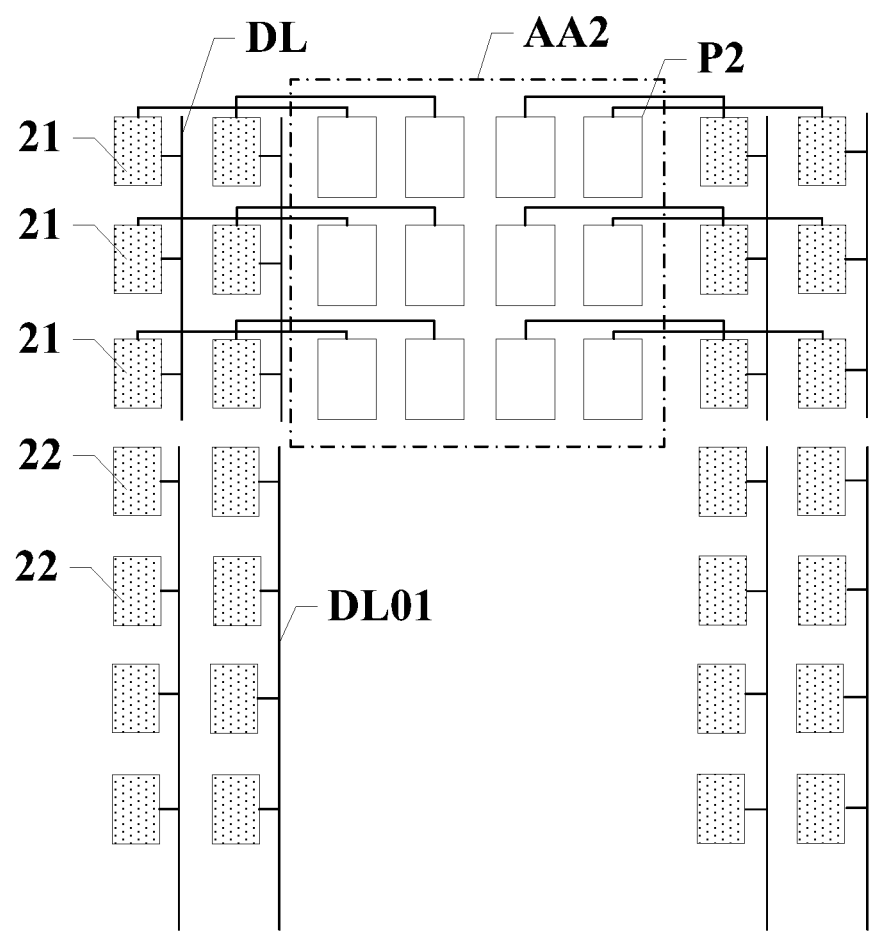
FIG. 8 is a schematic diagram illustrating the connection between pixel driving circuits in a first pixel drive unit column and data signal lines according to an embodiment of the present application.
Figure 9:
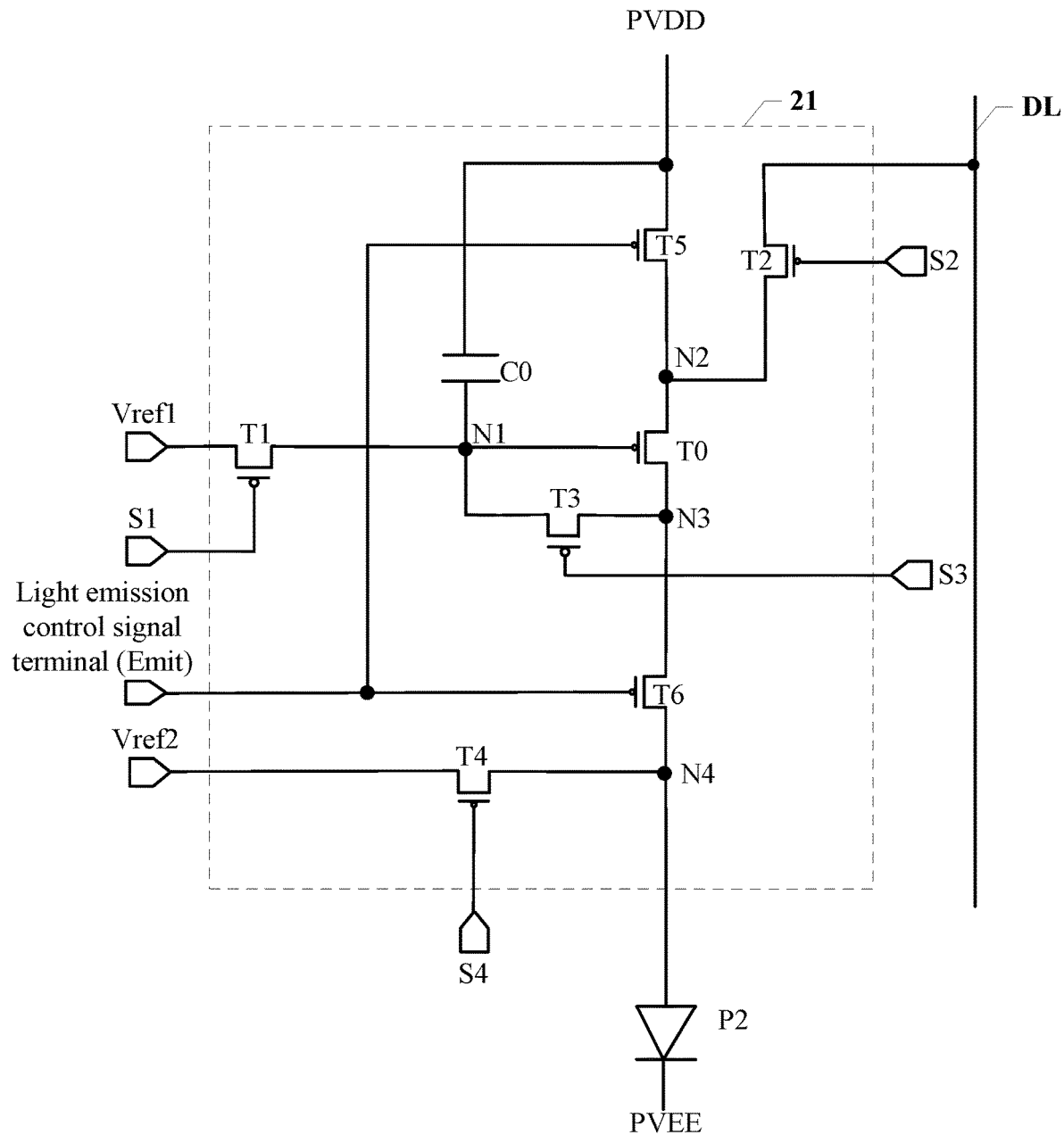
FIG. 9 is a schematic diagram illustrating the connection between a first pixel driving circuit and a data signal line in a display panel according to an embodiment of the present application.
Figure 10:
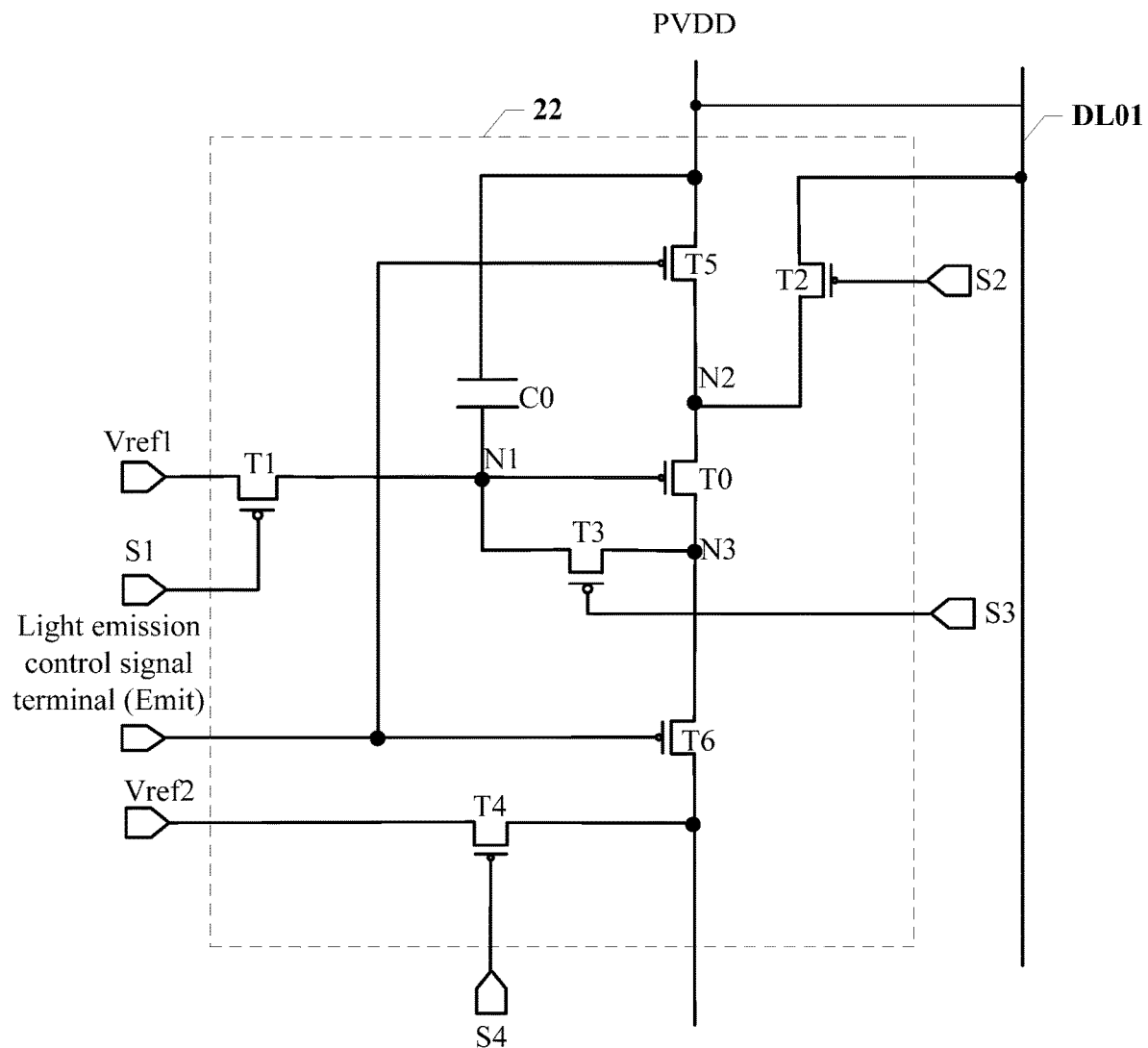
FIG. 10 is a schematic diagram illustrating the connection between a first dummy pixel driving circuit and a data signal line according to an embodiment of the present application.

FIG. 8 is a schematic diagram illustrating the connection between pixel driving circuits in a first pixel drive unit column and data signal lines according to an embodiment of the present application, FIG. 9 is a schematic diagram illustrating the connection between a first pixel driving circuit and a data signal line in a display panel according to an embodiment of the present application, and FIG. 10 is a schematic diagram illustrating the connection between a first dummy pixel driving circuit and a data signal line according to an embodiment of the present application. Referring to FIGS. 8 to 10, in an embodiment of the present application, the first display region AA1 further includes a first dummy data signal line DL01 electrically connected to the first dummy pixel driving circuits 22, and the first dummy data signal line DL01 is electrically connected to a fixed voltage signal terminal.

The display panel 100 is generally provided with multiple data signal lines, and the pixel driving circuits for driving the light-emitting elements to emit light are connected to a data signal line DL and configured to acquire a data signal and finally generate the drive current or drive voltage for driving the light-emitting elements to emit light. In the manufacturing process of the data signal lines, multiple data signal lines are manufactured in the same process, and among the formed data signal lines, the data signal line connected to the first dummy pixel driving circuits 22 is the first dummy data signal line DL01 and actually does not implement the function of transmitting the data signal to the first dummy pixel driving circuits 22, while the data signal line connected to other pixel driving circuits that can actually play a driving role can transmit the data signal in the true sense. In the embodiment of the present application, the first dummy data signal line DL01 that does not implement the function of transmitting the data signal is retained, and the process of removing this data signal line does not need to be introduced, which is conducive to simplifying the manufacturing process of the display panel 100 and improving the production efficiency of the display panel 100. Considering that the connection between the pixel driving circuits and the data signal lines in the display panel 100 is completed in the same process, in this embodiment, the connection between the first dummy data signal line DL01 and the first dummy pixel driving circuits 22 is retained, and other manufacturing processes do not need to be introduced, which is also conducive to improving the manufacturing efficiency of the display panel 100. In an embodiment, the data signal lines in the display panel 100 are uniformly arranged, thereby improving the overall display uniformity of the display panel 100, which is conducive to avoiding the uneven black states of the display panel 100 when the screen is off.

In the embodiment shown in FIGS. 9 and 10, the 7 Transistor 1 Capacitor (7T1C) pixel driving circuit is used as an example for illustration, and the structure of the pixel driving circuit in the present application is not limited. In some other embodiments of the present application, the pixel driving circuit may be embodied in other structures such as 8T1C. The first pixel driving circuit 21 shown in FIG. 9 is used as an example. The first pixel driving circuit 21 includes a drive transistor T0, a first transistor T1 to a sixth transistor T6, and a storage capacitor C0. A gate of the drive transistor T0 is connected to a first node N1, a first pole is connected to a second node N2, a second pole is connected to a third node N3, and the second light-emitting element P2 is connected in series between a fourth node N4 and a second power terminal PVEE. The first transistor T1 is connected in series between a first reset terminal Vref1 and the first node N1, the second transistor T2 is connected in series between the data signal line DL and the second node N2, the third transistor T3 is connected in series between the first node N1 and the third node N3, the fourth transistor T4 is connected in series between a second reset terminal Vref2 and the fourth node N4, the fifth transistor T5 is connected in series between a first power terminal PVDD and the second node N2, the sixth transistor T6 is connected in series between the third node N3 and the fourth node N4, and the storage capacitor C0 is connected in series between the first power terminal PVDD and the first node N1.

With continued reference to FIG. 9, the working stages of the first pixel driving circuit 21 include a first reset stage, a second reset stage, a data write stage, and a light emission stage. In the first reset stage, the first transistor T1 is turned on in response to the on level of a first control terminal S1 and transmits a reset signal of the first reset terminal Vref1 to the first node N1. In the second reset stage, the fourth transistor T4 is turned on in response to the on level of a fourth control terminal S4 and transmits a reset signal of the second reset terminal Vref2 to the fourth node N4 to reset the anode of the second light-emitting element P2. In the data write stage, the second transistor T2 is turned on in response to the on level of a second control terminal S3, the third transistor T3 is turned on in response to the on level of a third control terminal S3 the data signal on the data signal line DL is transmitted to the second node N2, the signal of the second node N2 is transmitted to the third node N3 through the drive transistor T0, and the signal of the third node N3 is transmitted to the first node N1. In the light emission stage, the fifth transistor T5 and the sixth transistor T6 are turned on in response to the signal of a light emission control signal terminal Emit, and the drive transistor T0 transmits the drive signal to the second light-emitting element P2 to drive the second light-emitting element P2 to emit light. The first reset stage and the second reset stage may be performed simultaneously or in different periods, which is not limited in the embodiment of the present application. The working process of the pixel driving circuit is only for illustration, and the actual working process of the pixel driving circuit of the present application is not limited. In an embodiment, the composition of the first dummy pixel driving circuit 22 in the embodiment shown in FIG. 10 is the same as the composition of the first pixel driving circuit in FIG. 9.

When the pixel driving circuit can actually play a driving role, for example, referring to FIG. 9, the pixel driving circuit is electrically connected to the light-emitting element P on the display panel 100, and the pixel driving circuit is electrically connected to the data signal line DL that can actually transmit the data signal on the display panel 100. When the pixel driving circuit is a pixel driving circuit that does not play a driving role such as the first dummy pixel driving circuit 22, for example, referring to FIG. 10, the first dummy pixel driving circuit 22 is not electrically connected to the light-emitting element P on the display panel 100, and the first dummy data signal line DL01 connected to the first dummy pixel driving circuit 22 does not implement the function of transmitting the data signal. In this embodiment, the first dummy data signal line DL01 is electrically connected to the fixed voltage signal terminal in the display panel 100 so that the first dummy data signal line DL01 receives a fixed voltage signal, so as to prevent the static electricity from being introduced into the inside of the display panel 100 through the first dummy data signal line DL01 and affecting the normal display of the display panel 100 when the first dummy data signal line DL01 floats, which is conducive to improving the overall antistatic capability of the display panel 100.

Referring to FIG. 10, the preceding fixed voltage terminal may be, for example, the first power terminal PVDD or the second power terminal PVEE in the display panel 100 or may be the first reset terminal Vref1 or the second reset terminal Vref2, which is not limited in the present application.

Referring to FIG. 1, in an embodiment of the present application, the light-emitting element density of the optical component region AA2 is the same as the light-emitting element density of the first display region AA1.

The same density of the light-emitting elements P mentioned in the embodiment of the present application means that the number of the light-emitting elements P included in the same unit area is the same. For example, the shape and arrangement of the light-emitting elements P in the first display region AA1 are the same as the shape and arrangement of the light-emitting elements P in the optical component region AA2 so that the light-emitting elements P can be uniformly arranged in the first display region AA1 and the optical component region AA2 of the display panel 100 as a whole. In the display stage, the brightness of the optical component region AA2 and the brightness of the first display region AA1 are consistent or tend to be consistent, thereby effectively improving the display brightness uniformity of the display panel 100 having the optical component region AA2.

In conjunction with FIGS. 1 and 2, in an embodiment of the present application, the total number of the pixel driving circuits 20 included in the display panel 100 is greater than the total number of the light-emitting elements P. The pixel driving circuits 20 here include not only the pixel driving circuits connected to the first light-emitting elements P1 in the first display region AA1 and the pixel driving circuits connected to the second light-emitting elements P2 in the optical component region AA2 but also the dummy pixel driving circuits.

In the display panel 100 provided in the embodiment of the present application, the first pixel driving circuits 21 and the second light-emitting elements P2 in the optical component region AA2 are in one-to-one correspondence, and the first light-emitting elements P1 in the first display region AA1 and the pixel driving circuits are electrically connected in one-to-one correspondence. In this embodiment, the total number of the pixel driving circuits included in the display panel 100 is limited to be greater than the total number of the light-emitting elements. Since the pixel driving circuits in the present application are all disposed in the first display region AA1, in addition to the pixel driving circuits separately electrically connected to the first light-emitting elements P1 and the second light-emitting elements P2, the first display region AA1 is also provided with the dummy pixel driving circuits, that is, the pixel driving circuits not connected to the first light-emitting elements P1 or the second light-emitting elements P2. In the manufacturing process of the pixel driving circuits, when the pixel driving circuits electrically connected to the second light-emitting elements P2 are disposed in the first display region AA1, all the pixel driving circuits in the first display region AA1 are manufactured together, and the number of the manufactured pixel driving circuits is greater than the number of the light-emitting elements P. In this manner, while multiple light-emitting elements P can be driven, redundant pixel driving circuits are used as the dummy pixel driving circuits rather than being removed so that the process of removing the dummy pixel driving circuits does not need to be introduced, which is conducive to simplifying the manufacturing process of the display panel 100 and improving the production efficiency of the display panel 100.

With continued reference to FIGS. 3, 5, and 7, in an embodiment of the present application, along the first direction D1, at least part of the first pixel driving circuits 21 in the first pixel drive unit column 11 overlap the optical component region AA2.

At least part of the first pixel driving circuits 21 overlap the optical component region AA2 along the first direction D1, which means that at least part of the first pixel driving circuits 21 are located on one side or two sides of the optical component region AA2 along the first direction D1, which is conducive to reducing the distance between the first pixel driving circuit 21 and the second light-emitting element P2 that are connected, that is, when the connection lead L0 is used to electrically connect the first pixel driving circuit 21 to the second light-emitting element P2, the length of the connection lead L0 is reduced, which is conducive to reducing the wiring difficulty of the connection lead L0 and improving the manufacturing efficiency of the display panel 100.

In the present application, referring to FIG. 2, when the first pixel driving circuits 21 connected to the second light-emitting elements P2 in the optical component region AA2 are disposed in the first display region AA1, it is equivalent to increasing the number of the pixel driving circuits 20 included in the first display region AA1. To make space for disposing the first pixel drive unit column 11 where the first pixel driving circuits 21 are located, one method is to reduce the distance between part of the pixel drive unit columns adjacent to the optical component region AA2 along the first direction D1 to make space for disposing the newly added first pixel drive unit column 11, where the pixel drive unit columns in other regions remain unchanged. For example, referring to FIG. 2, the first pixel drive unit column 11 is newly added in a first region A1, and the first pixel drive unit column 11 is not newly added in a second region A2; at this time, the arrangement density of the pixel drive unit columns in the first region A1 is greater than the arrangement density of the pixel drive unit columns in the second region A2, that is, the distance between the adjacent pixel drive unit columns in the first region A1 is less than the distance between the adjacent pixel drive unit columns in the second region A2.

Figure 11:
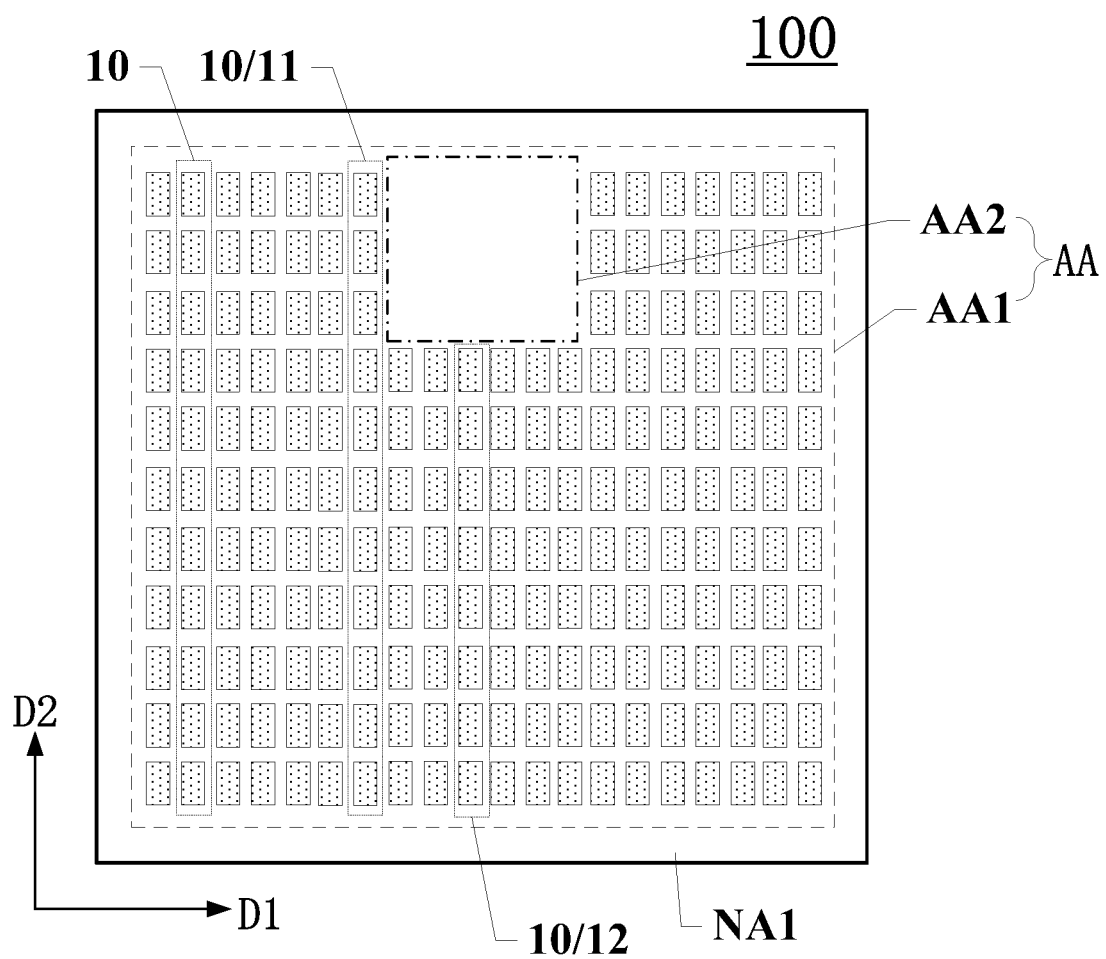
FIG. 11 is a schematic diagram illustrating the arrangement of pixel driving circuits in another display panel according to an embodiment of the present application.

FIG. 11 is a schematic diagram illustrating the arrangement of pixel driving circuits in another display panel according to an embodiment of the present application. This embodiment shows another arrangement of multiple pixel drive unit columns 10 when the first pixel drive unit column 11 is introduced into the first display region AA1. Referring to FIG. 11, in an embodiment of the present application, the pixel drive unit columns 10 are uniformly arranged in the first direction D1.

When the first pixel drive unit column 11 is introduced into the first display region AA1, the first pixel drive unit column 11 and other pixel drive unit columns may be uniformly arranged in the first display region AA1, that is, the distance between any two adjacent pixel drive unit columns 10 along the first direction D1 is the same, which is conducive to improving the overall wiring arrangement uniformity in the first display region AA1 of the display panel 100 and reducing or avoiding the problem of uneven display brightness caused by the uneven arrangement of the pixel circuits. Therefore, the uniform arrangement of the pixel drive unit columns 10 is conducive to improving the overall display effect of the display panel 100.

Figure 12:
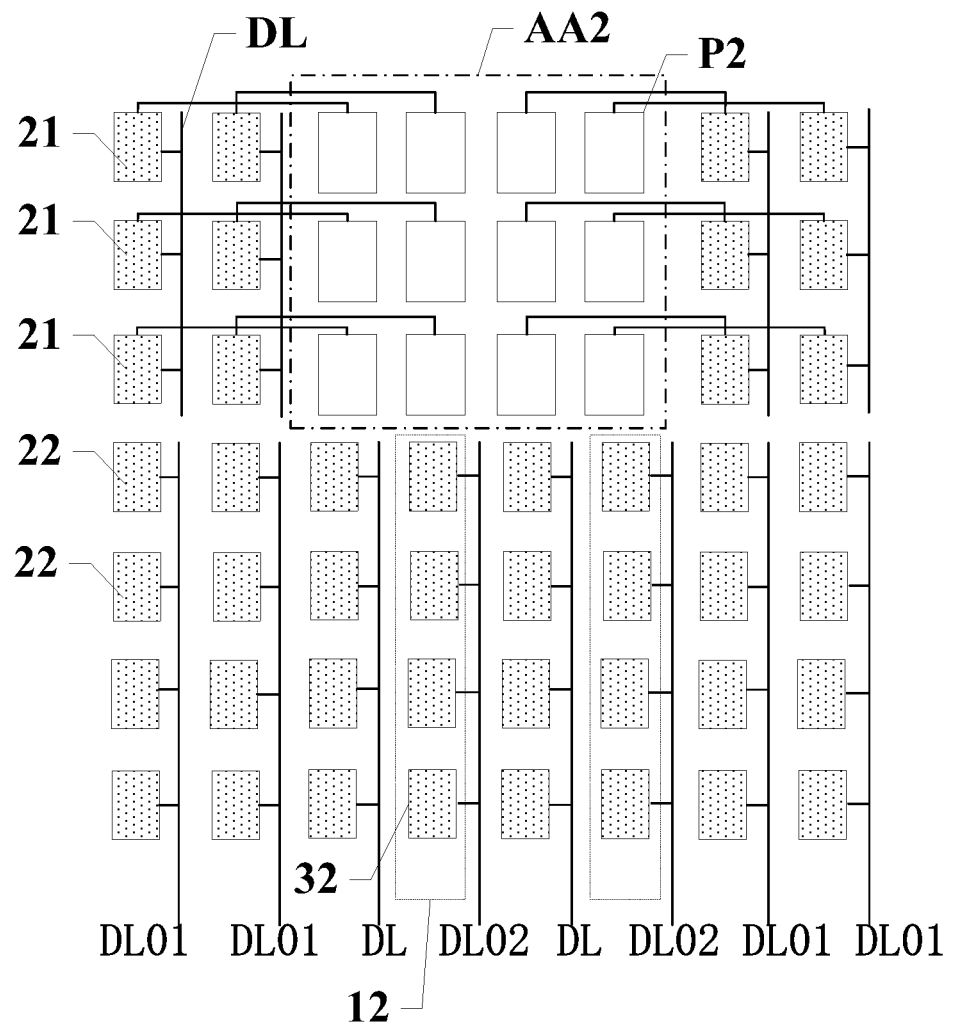
FIG. 12 is a schematic diagram illustrating the distribution of pixel drive unit columns around an optical component region according to an embodiment of the present application.

FIG. 12 is a schematic diagram illustrating the distribution of pixel drive unit columns around an optical component region according to an embodiment of the present application. Referring to FIGS. 11 and 12 adaptively, in an embodiment of the present application, the display panel 100 further includes a first non-display region NA1, the pixel drive unit columns 10 include a second pixel drive unit column 12, and the second pixel drive unit column 12 includes multiple (two or more) second dummy pixel driving circuits 32; the second pixel drive unit column 12 is located between the first non-display region NA1 and the optical component region AA2 along the second direction D2, where the second direction D2 intersects with the first direction D1.

The embodiment shown in FIG. 11 shows the solution in which the first non-display region NA1 is the lower bezel region of the display panel 100. In some other embodiments of the present application, the first non-display region NA1 may be the upper bezel region of the display panel 100, and the second pixel drive unit column 12 may be located between the upper bezel region and the optical component region AA2. Alternatively, the second pixel drive unit columns 12 are disposed separately between the upper bezel of the display panel 100 and the optical component region AA2 and between the lower bezel of the display panel 100 and the optical component region AA2. In this embodiment, only the case where the second pixel drive unit column 12 is located between the optical component region AA2 and the lower bezel of the display panel 100 is used as an example for description.

When the first pixel drive unit columns 11 are introduced on two sides of the optical component region AA2 along the first direction D1, to improve the overall distribution uniformity of the pixel drive unit columns 10 on the display panel 100, the second pixel drive unit columns 12 may be introduced on one side or two sides of the optical component region AA2 along the second direction D2, where the second pixel drive unit column 12 includes the second dummy pixel driving circuits 32. In this manner, when the pixel drive unit columns are actually manufactured, the pixel drive unit columns may be manufactured according to the uniform distribution of the pixel drive unit columns as a whole, and the redundant pixel drive unit columns in the optical component region AA2 may be used as the second pixel drive unit columns 12 without the additional introduction of a process of removing the redundant pixel drive unit columns, which is conducive to simplifying the manufacturing process of the display panel 100 while the overall arrangement uniformity of the pixel drive unit columns is ensured.

In conjunction with FIGS. 11 and 12, in an embodiment of the present application, the first display region AA1 further includes a second dummy data signal line DL02 electrically connected to the second dummy pixel driving circuits 32, and the second dummy data signal line DL02 is electrically connected to a fixed voltage signal terminal.

In the manufacturing process of the data signal lines, multiple data signal lines are manufactured in the same process, and among the formed data signal lines, the data signal line connected to the second dummy pixel driving circuits 32 is the second dummy data signal line DL02 and actually does not implement the function of transmitting the data signal to the second dummy pixel driving circuits 32; while the data signal line DL connected to other pixel driving circuits that can actually play a driving role can transmit the data signal in the true sense. In the embodiment of the present application, the second dummy data signal line DL02 that does not implement the function of transmitting the data signal is retained, and the process of removing this data signal line does not need to be introduced, which is conducive to simplifying the manufacturing process of the display panel 100 and improving the production efficiency of the display panel 100. Considering that the connection between the pixel driving circuits and the data signal lines in the display panel 100 is completed in the same process, in this embodiment, the connection between the second dummy data signal line DL02 and the second dummy pixel driving circuits 32 is retained, and other manufacturing processes do not need to be introduced, which is also conducive to improving the manufacturing efficiency of the display panel 100. In an embodiment, the second dummy pixel driving circuits 32 are reused as repairing pixel driving circuits, that is, when the pixel driving circuits corresponding to the first light-emitting elements P1 and/or the second light-emitting elements P2 are in an abnormal working state, the second dummy pixel driving circuits 32 are configured to work instead.

Figure 13:
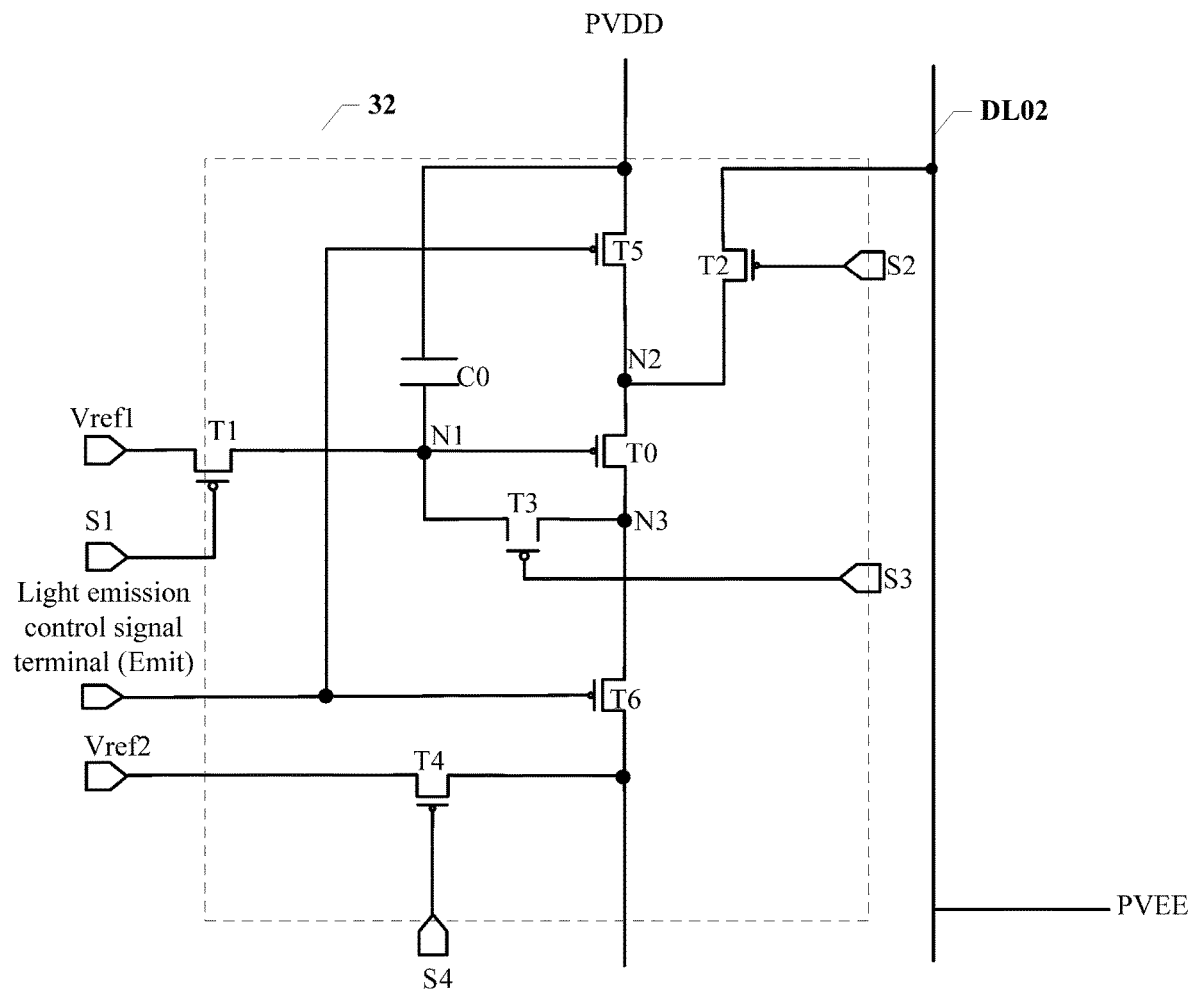
FIG. 13 is a schematic diagram illustrating the connection between a second dummy pixel driving circuit and a data signal line according to an embodiment of the present application.

FIG. 13 is a schematic diagram illustrating the connection between a second dummy pixel driving circuit and a data signal line according to an embodiment of the present application. The composition of the second dummy pixel driving circuit 32 is the same as the composition of the first dummy pixel driving circuit 22 and the composition of the first pixel driving circuit 21. For example, the second dummy pixel driving circuit 32 is embodied as a 7T1C structure, and for the connection relationship of the 7T1C structure, reference may be made to the connection relationship between the transistors and the capacitor in the first pixel driving circuit 21 in FIG. 9. The details are not repeated here. In this embodiment, the second dummy data signal line DL02 is electrically connected to the fixed voltage signal terminal in the display panel 100 so that the second dummy data signal line DL02 receives a fixed voltage signal, so as to prevent the static electricity from being introduced into the inside of the display panel 100 through the second dummy data signal line DL02 and affecting the normal display of the display panel 100 when the second dummy data signal line DL02 floats, which is conducive to improving the overall antistatic capability of the display panel 100. Referring to FIG. 13, the preceding fixed voltage terminal may be, for example, the first power terminal PVDD or the second power terminal PVEE in the display panel 100 or may be the first reset terminal Vref1 or the second reset terminal Vref2, which is not limited in the present application.

Figure 14:
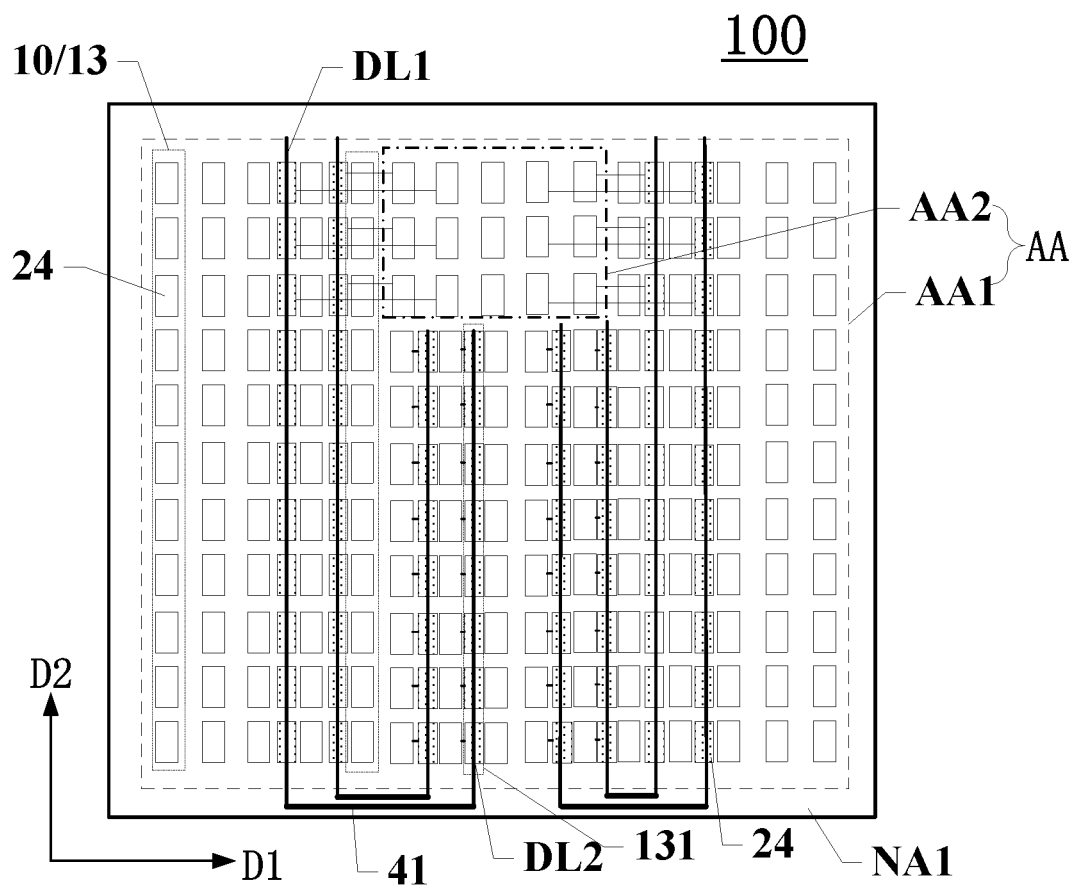
FIG. 14 is a structural diagram of another display panel according to an embodiment of the present application.

FIG. 14 is a structural diagram of another display panel according to an embodiment of the present application. This embodiment shows the first light-emitting elements P1 and the second light-emitting elements P2 in the first display region AA1 and the optical component region AA2 of the display panel 100 and shows part of the pixel driving circuits in the first display region AA1, but does not show all the pixel driving circuits in the first display region AA1.

Referring to FIG. 14, in an embodiment of the present application, the pixel drive unit columns 10 further includes a third pixel drive unit column 13 located in the first display region AA1, the third pixel drive unit column 13 includes multiple (two and more) second pixel driving circuits 24, and the second pixel driving circuits 24 are electrically connected to the first light-emitting elements P1. The third pixel drive unit column 13 includes a first sub-third pixel drive unit column 131. The display panel 100 further includes the first non-display region NA1, and the first sub-third pixel drive unit column 131 is located between the first non-display region NA1 and the optical component region AA2 along the second direction D2, where the second direction D2 intersects with the first direction D1. The first display region AA1 further includes multiple data signal lines DL. The data signal lines DL include a first data signal line DL1 and a second data signal line DL2. The first data signal line DL1 is electrically connected to the first pixel driving circuits 21. The second data signal line DL2 is electrically connected to the second pixel driving circuits 24 in the first sub-third pixel drive unit column 131. The first data signal line DL1 is electrically connected to the second data signal line DL2.

With continued reference to FIG. 14, in this embodiment, the first pixel driving circuits 21 electrically connected to the second light-emitting elements P2 in the optical component region AA2 are connected to the first data signal line DL1, the second pixel driving circuits 24 that are connected to the first light-emitting elements P1 and located in the first sub-third pixel drive unit column 131 are connected to the second data signal line DL2, and the first data signal line DL1 is electrically connected to the second data signal line DL2. In an embodiment, the second light-emitting elements P2 corresponding to the first data signal line DL1 and the first light-emitting elements P1 corresponding to the second data signal line DL2 are located in the same pixel column so that the light-emitting elements P in the same column transmit the data signal through the same data signal line (here, a data signal line formed by connecting the first data signal line DL1 and the second data signal line DL2). In an embodiment, the data signal line acquires the data signal through a data signal terminal. When the first data signal line DL1 and the second data signal line DL2 are electrically connected, only one data signal terminal needs to be provided for the first data signal line DL1 and the second data signal line DL2 without the need to introduce different data signal terminals for the first data signal line DL1 and the second data signal line DL2 so the design of a bonding region does not need to be changed, and the manufacturing complexity of the display panel 100 is not increased.

With continued reference to FIG. 14, in an embodiment of the present application, the first data signal line DL1 and the second data signal line DL2 are electrically connected through a first connecting portion 41, where the first connecting portion 41 is located in the display region AA or the first non-display region NA1.

The embodiment shown in FIG. 14 shows the solution in which an end of the first data signal line DL1 facing away from the optical component region AA2 and an end of the second data signal line DL2 facing away from the optical component region AA2 are electrically connected through the first connecting portion 41 disposed in the first non-display region NA1. When the first connecting portion 41 is disposed in the first non-display region NA1, the first connecting portion 41 does not occupy the space of the display region AA, thereby not affecting the aperture ratio of the display region AA. In an embodiment, when the first connecting portion 41 is disposed in the first non-display region NA1, the first connecting portion 41 may be disposed in the same layer as the first data signal line DL1 and/or the second data signal line DL2 or may be disposed in a different layer from the first data signal line DL1 and the second data signal line DL2, which is not limited in the present application.

Figure 15:
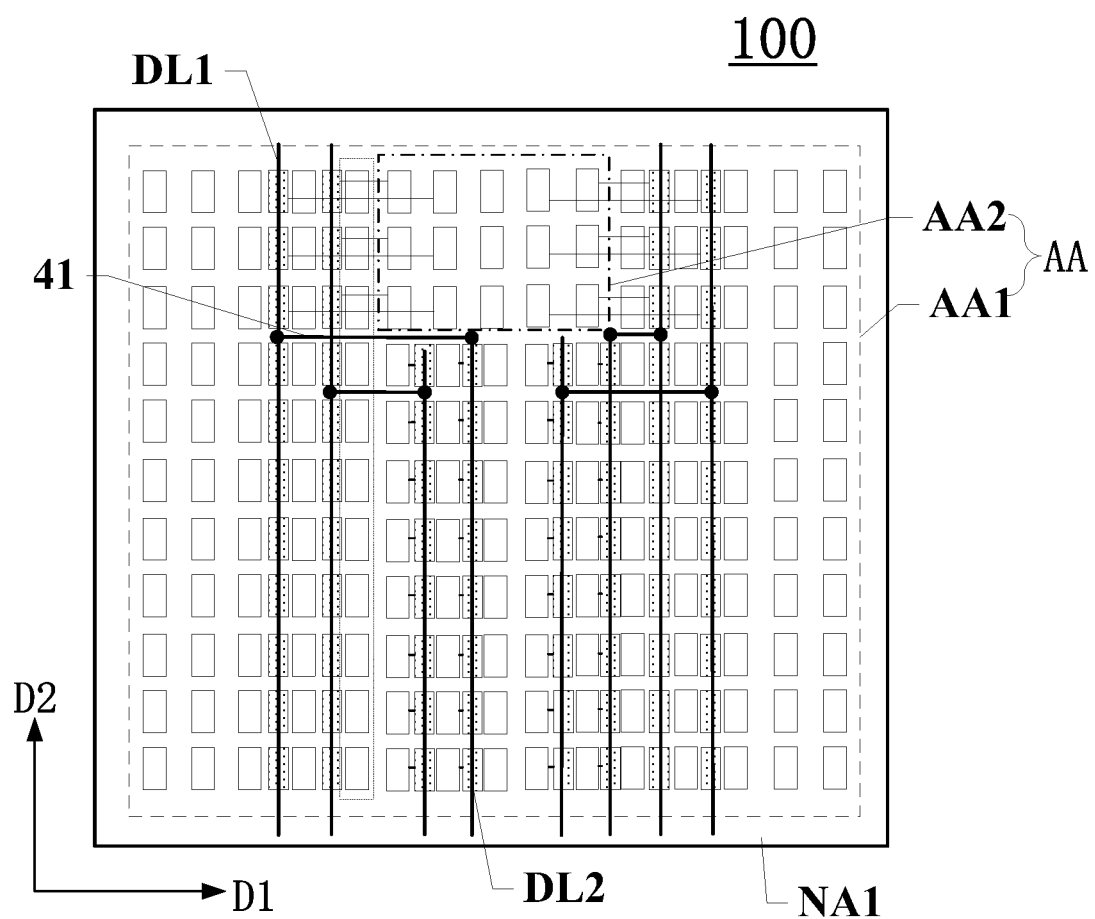
FIG. 15 is a structural diagram of another display panel according to an embodiment of the present application.

In some other embodiments of the present application, the first connecting portion 41 may be disposed in the display region AA. For example, referring to FIG. 15, FIG. 15 is a structural diagram of another display panel according to an embodiment of the present application. In this embodiment, an end of the second data signal line DL2 facing the optical component region AA2 is electrically connected to the first data signal line DL1 through the first connecting portion 41. In this case, the first connecting portion 41 is located in the display region AA. In an embodiment, the first connecting portion 41 located in the display region AA is disposed in a different layer from the first data signal line DL1 and the second data signal line DL2, so as to avoid an unreliable connection between the first data signal line DL1 and the second data signal line DL2 due to the insufficient space in the display region AA. If the film where the first data signal line DL1 and the second data signal line DL2 are located has enough space for disposing the first connecting portion 41, the first connecting portion 41 may be disposed in the same layer as the first data signal line DL1 and/or the second data signal line DL2. When the first connecting portion 41 located in the display region AA is used to electrically connect the first data signal line DL1 to the second data signal line DL2, the first data signal line DL1 and the second data signal line DL2 that are electrically connected can still share the same data signal terminal to acquire the data signal so that the manufacturing complexity of the display panel 100 is not increased.

Figure 16:
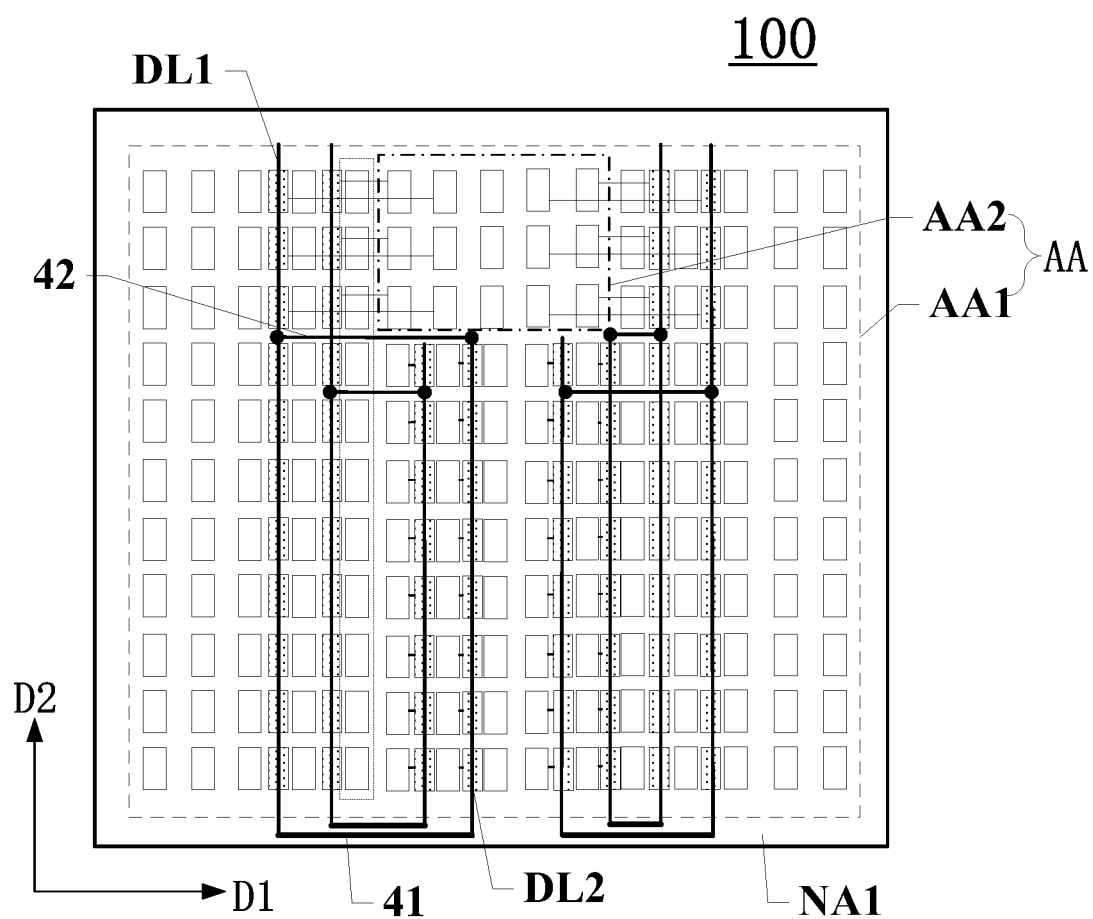
FIG. 16 is a structural diagram of another display panel according to an embodiment of the present application.

FIG. 16 is a structural diagram of another display panel according to an embodiment of the present application. This embodiment shows the solution in which the first data signal line DL1 and the corresponding second data signal line DL2 are electrically connected through the first connecting portion 41 and a second connecting portion 42.

Referring to FIG. 16, in an embodiment of the present application, the first data signal line DL1 and the second data signal line DL2 are electrically connected in the first non-display region NA1 through the first connecting portion 41 and connected in the display region AA through the second connecting portion 42.

The first data signal line DL1 corresponding to the second light-emitting elements P2 in the optical component region AA2 and the second data signal line DL2 corresponding to the first light-emitting elements P1 in the first display region AA1 are electrically connected in another method in which the first data signal line DL1 and the second data signal line DL2 are electrically connected through the first connecting portion 41 located in the first non-display region NA1 and are electrically connected through the second connecting portion 42 located in the display region AA. In an embodiment, in the display region AA, the end of the second data signal line DL2 facing the optical component region AA2 is electrically connected through the second connecting portion 42 so that the second data signal line DL2 forms a parallel relationship with at least part of the line segments in the first data signal line DL1, thereby effectively reducing the impedance of the first data signal line DL1 and the second data signal line DL2 that are connected to each other, which is conducive to avoiding too large a voltage drop caused by the excessive impedance of the data signal transmitted on the first data signal line DL1 and the second data signal line DL2 and improving the accuracy of the data signal transmitted on the first data signal line DL1 and the second data signal line DL2.

Figure 17:
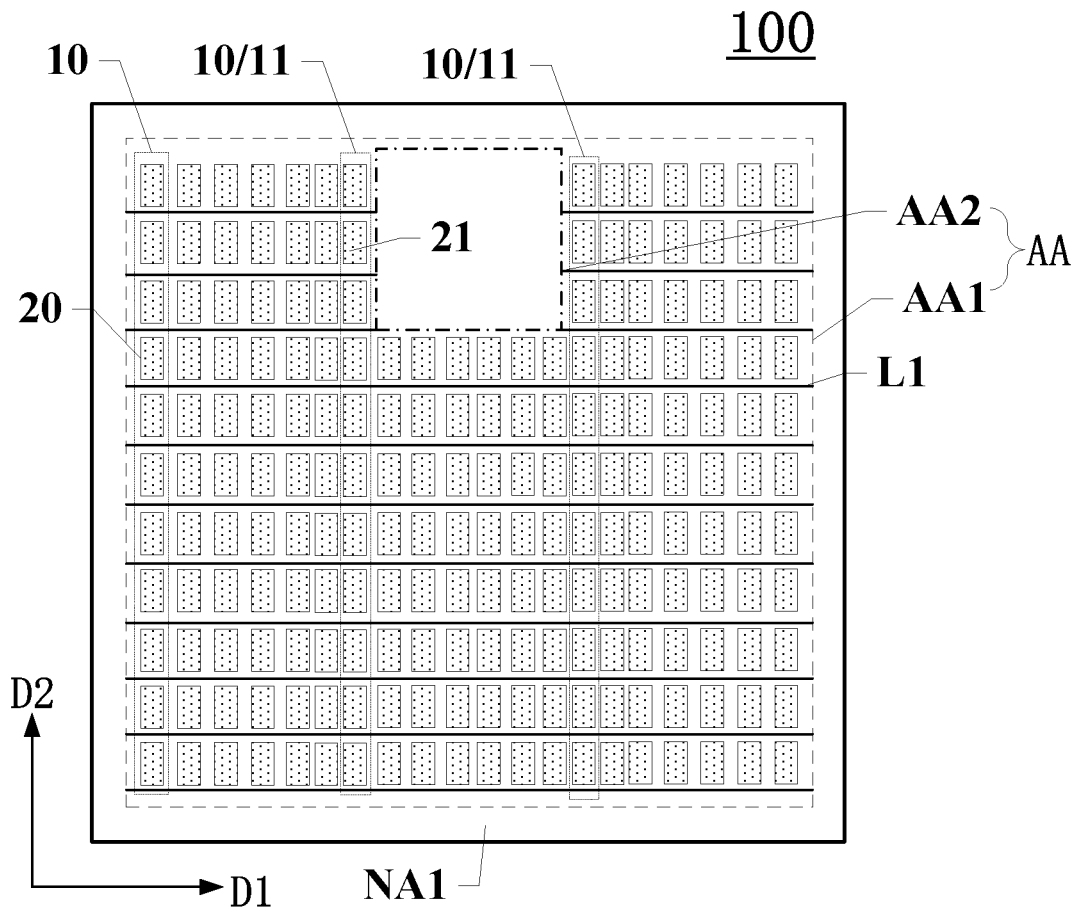
FIG. 17 is a structural diagram of another display panel according to an embodiment of the present application.
Figure 18:
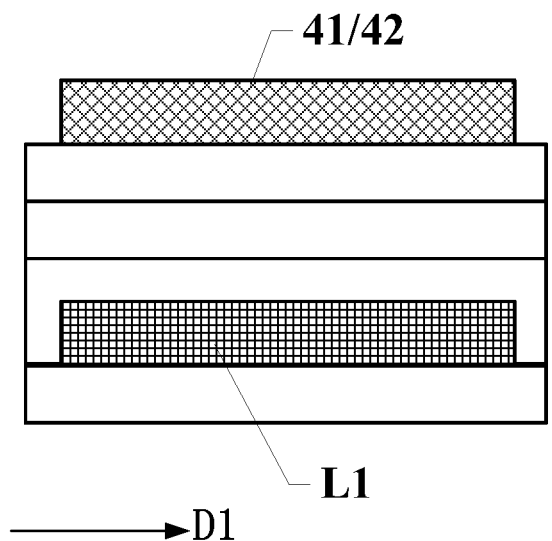
FIG. 18 is a schematic diagram illustrating films of a first signal line and a first connecting portion or a second connecting portion according to an embodiment of the present application.

FIG. 17 is a structural diagram of another display panel according to an embodiment of the present application. To illustrate a first signal line L1 in the display panel 100, other signal lines in the first display region AA1 are not shown in FIG. 17. FIG. 18 is a schematic diagram illustrating films of a first signal line and a first connecting portion or a second connecting portion according to an embodiment of the present application. Referring to FIGS. 17 and 18, in conjunction with FIG. 6, in an embodiment of the present application, the first display region AA1 includes the first signal line L1 extending along the first direction D1, and the second connecting portion 42 overlaps the first signal line L1 in a thickness direction of the display panel 100.

In conjunction with FIG. 6 and FIGS. 14 to 18, the overall extension direction of the data signal lines in an embodiment of the present application is the second direction D2. In an embodiment, the display panel 100 is further provided with the first signal line L1 extending along the first direction D1, such as a scan line or a reset signal line. In the embodiment shown in FIG. 18, the case where the first signal line L1 is a scan line disposed in the same layer as the gate of the drive transistor T0 is used as an example for description. In an embodiment, in the embodiment shown in FIG. 18, the case where the first connecting portion 41 or the second connecting portion 42 is disposed in the same layer as part of the connection lead L0 connecting the first pixel driving circuit 21 to the second light-emitting element P2 is used as an example for description. When the first data signal line DL1 and the second data signal line DL2 are electrically connected through the first connecting portion 41 or the second connecting portion 42, the second connecting portion 42 or the first connecting portion 41 overlaps the first signal line L1 along the thickness direction of the display panel 100, which is conducive to preventing the use experience of the display panel 100 from being affected by the uneven black states when the display region AA is off in the case where the first connecting portion 41 or the second connecting portion 42 is introduced into the display region AA. In an embodiment, the linewidth of the first connecting portion 41 or the second connecting portion 42 along the second direction D2 is less than or equal to the linewidth of the first signal line L1 along the second direction D2, and the edge of the first connecting portion 41 or the second connecting portion 42 extending along the first direction D1 does not exceed the edge of the first signal line L1 extending along the first direction D1, which is more conducive to avoiding the uneven black states when the screen is off.

Figure 19:
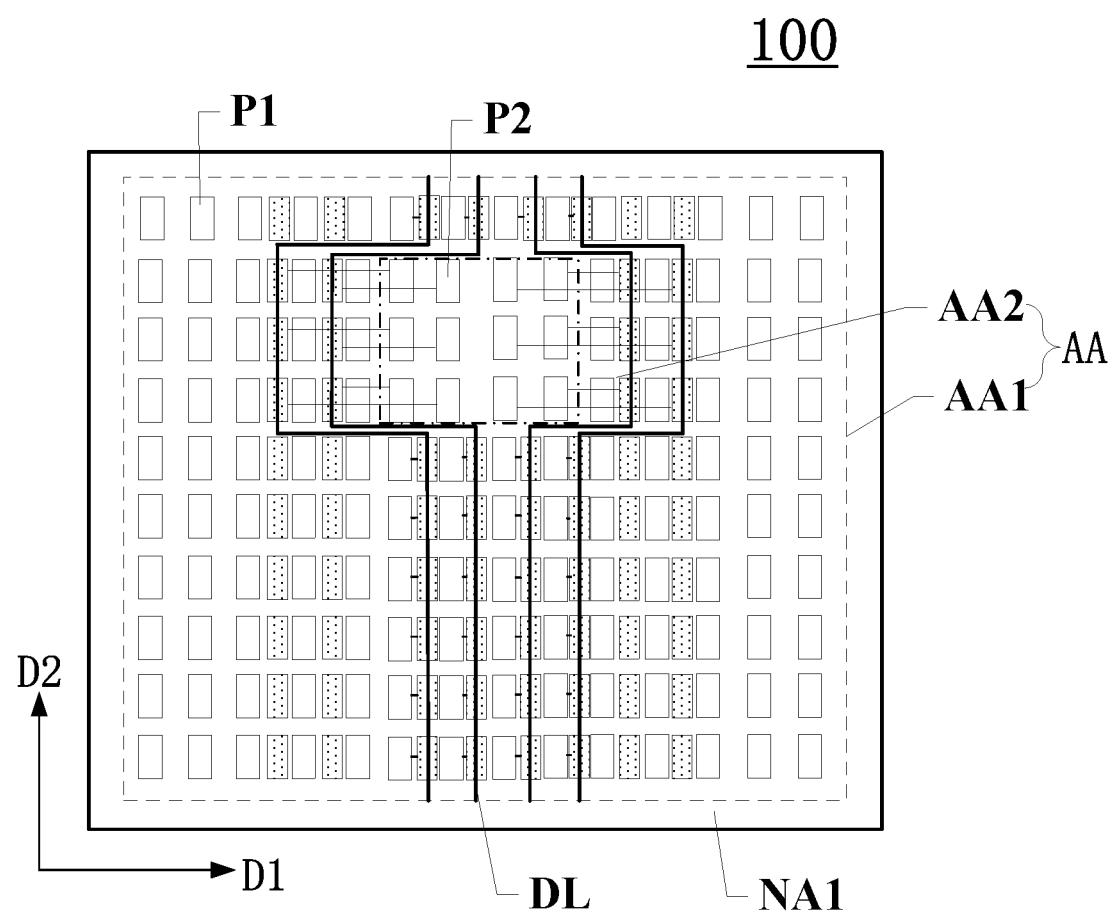
FIG. 19 is a structural diagram of another display panel according to an embodiment of the present application.

FIG. 19 is a structural diagram of another display panel according to an embodiment of the present application. This embodiment shows another schematic diagram illustrating the connection between the first data signal line DL1 and the second data signal line DL2 and shows the solution in which the first display region AA1 surrounds the optical component region AA2, that is, the first light-emitting elements P1 are disposed on two sides of the optical component region AA2 along the first direction D1 and on two sides of the optical component region AA2 along the second direction D2. In this embodiment, when part of the first light-emitting elements P1 located above the optical component region AA2, part of the second light-emitting elements P2 in the optical component region AA2, and part of the first light-emitting elements P1 located below the optical component region AA2 are disposed in the same column, the data signal lines connected to the pixel driving circuits corresponding to the three parts of light-emitting elements P are electrically connected, as long as the three data signal lines share the same data signal terminal.

Figure 20:
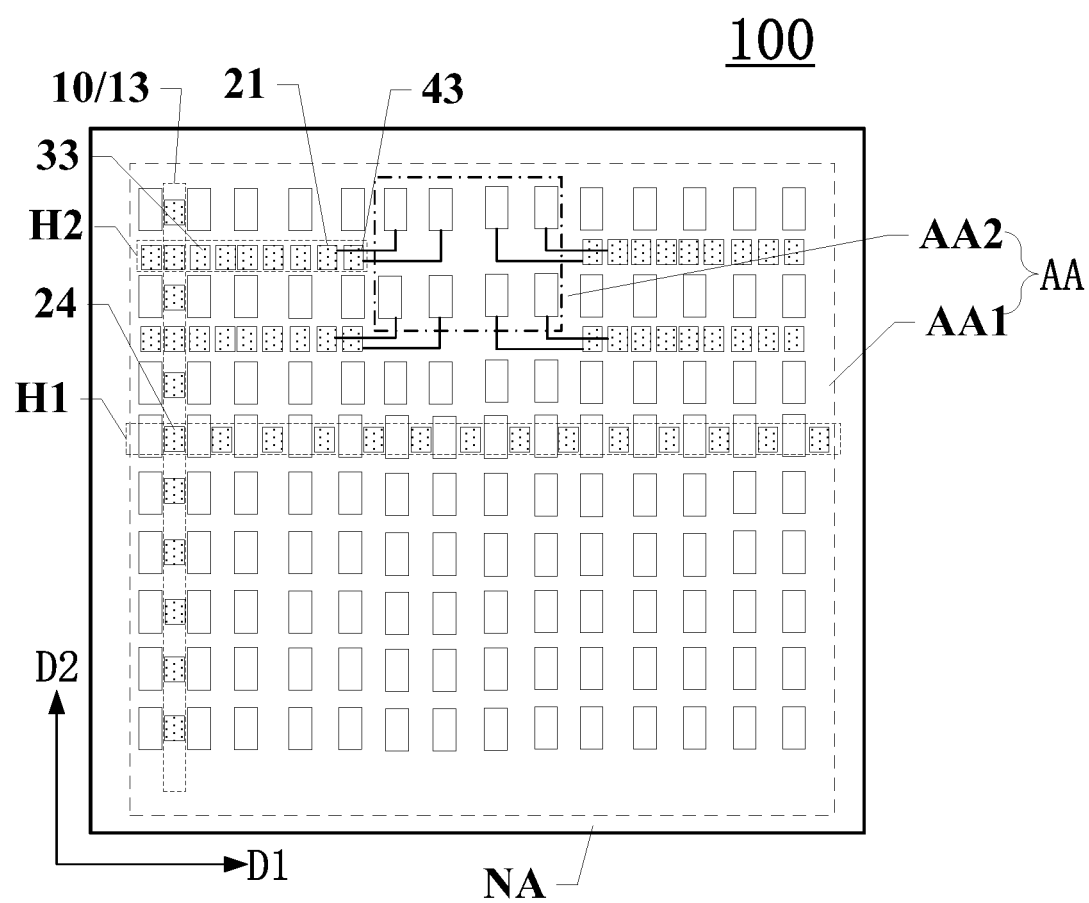
FIG. 20 is a structural diagram of another display panel according to an embodiment of the present application.

FIG. 20 is a structural diagram of another display panel according to an embodiment of the present application. This embodiment shows a schematic diagram illustrating the connection between the second light-emitting elements P2 and the first pixel driving circuits 21 when pixel drive unit rows are introduced into the display panel 100.

In an embodiment of the present application, the pixel drive unit columns 10 further include the third pixel drive unit column 13 located in the first display region AA1, the third pixel drive unit column 13 includes multiple (two or more) second pixel driving circuits 24, and the second pixel driving circuits 24 are electrically connected to the first light-emitting elements P1. The first display region AA1 further includes multiple (two or more) pixel drive unit rows arranged along the second direction D2. The pixel drive unit rows include a first pixel drive unit row H1 and a second pixel drive unit row H2. The first pixel drive unit row H1 includes multiple (two or more) second pixel driving circuits 24 arranged continuously. The second pixel drive unit row H2 includes multiple (two or more) third dummy pixel driving circuits 33 arranged continuously. The first pixel driving circuit 21 is electrically connected to the second light-emitting element P2 through a third connecting portion 43. The third connecting portion 43 overlaps the second pixel drive unit row H2 in the thickness direction of the display panel 100.

With continued reference to FIG. 20, this embodiment shows the solution in which the pixel drive unit rows are introduced into the display panel 100. FIG. 20 shows only part, not all, of the pixel driving circuits in the display panel 100. In an embodiment, at least part of the pixel drive unit rows are provided with the first pixel driving circuits 21 configured to be connected to the second light-emitting elements P2, and at least part of the pixel drive unit rows are provided with the pixel driving circuits configured to be connected to the first light-emitting elements P1. The pixel drive unit rows in this embodiment include the first pixel drive unit row H1 and the second pixel drive unit row H2, where the first pixel drive unit row H1 is provided with the second pixel driving circuits 24 configured to drive the first light-emitting elements P1 to emit light. In an embodiment, at least part of the second pixel driving circuits 24 are arranged continuously in the first pixel drive unit row H1. In an embodiment, at least part of the first pixel drive unit row H1 is further provided with dummy pixel driving circuits. The second pixel drive unit row H2 is provided with continuous third dummy pixel driving circuits 33. In an embodiment, the second pixel drive unit row H2 is further provided with the first pixel driving circuits 21 electrically connected to the second light-emitting elements P2. That is to say, in this embodiment, the second pixel drive unit row H2 in which the first pixel driving circuits 21 connected to the second light-emitting elements P2 are disposed is introduced. In the manufacturing process of the pixel driving circuits, the pixel driving circuits arranged in rows and columns are generally manufactured at the same time. While the first pixel driving circuits 21 are manufactured, the pixel driving circuits connected to the first light-emitting elements P1 and the dummy pixel driving circuits are manufactured. To avoid introducing the process of removing unnecessary pixel driving circuits (the pixel driving circuits that do not need to be connected to the light-emitting elements P), these unnecessary pixel driving circuits are generally retained as the dummy pixel driving circuits, such as the third dummy pixel driving circuits 33 in the second pixel drive unit row H2, which is conducive to simplifying the manufacturing process of the display panel 100. In addition, in this embodiment, when the third connecting portion 43 is used to electrically connect the first pixel driving circuit 21 in the second pixel drive unit row H2 to the second light-emitting element P2, the third connecting portion 43 is configured to overlap the second pixel drive unit row H2 in the thickness direction of the display panel 100 so that the third connecting portion 43 does not occupy other original spaces in the display region AA and only occupies the space where the newly added second pixel drive unit row H2 is located, thereby not affecting other circuit structures in the display region AA. In addition, the method of disposing the third connecting portion 43 in the second pixel drive unit row H2 is conducive to simplifying the wiring process of the third connecting portion 43, simplifying the overall manufacturing process of the display panel 100, and improving the production efficiency. In an embodiment, the third dummy pixel driving circuits 33 are reused as repairing pixel driving circuits, that is, when the pixel driving circuits corresponding to the first light-emitting elements P1 and/or the second light-emitting elements P2 are in an abnormal working state, the third dummy pixel driving circuits 33 are configured to work instead.

Figure 21:
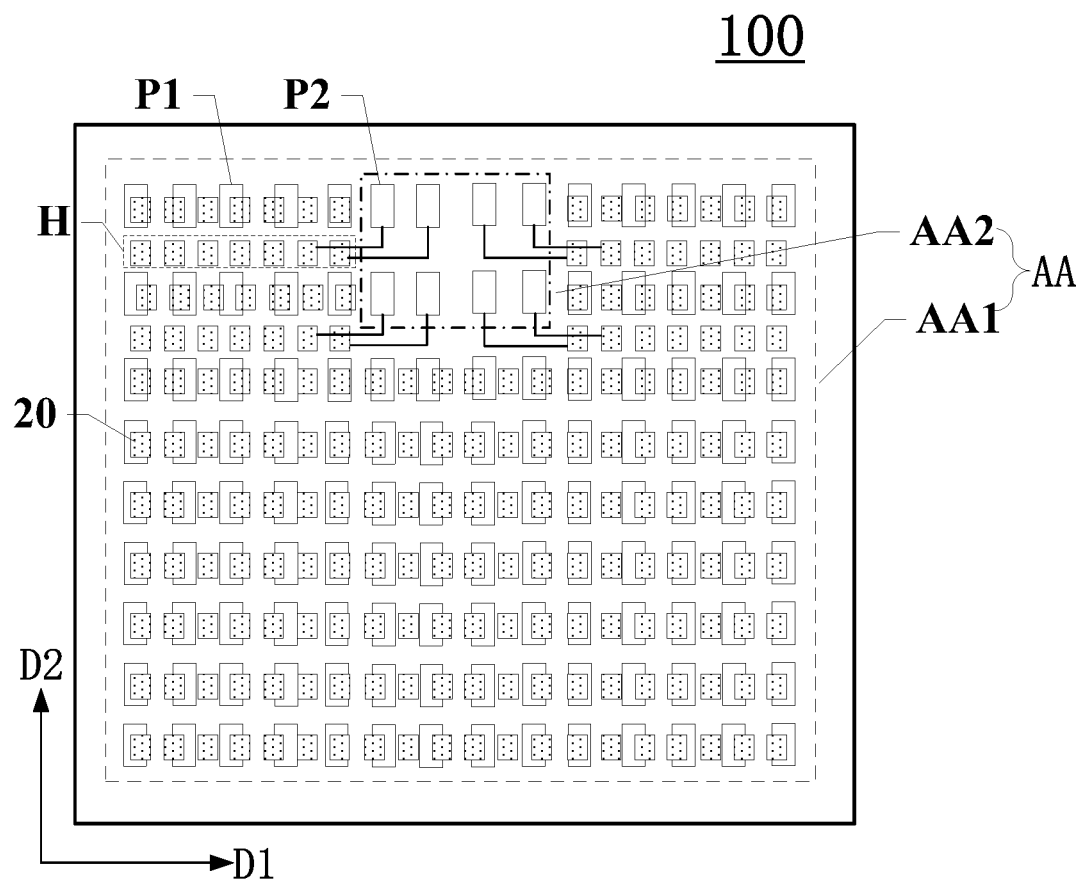
FIG. 21 is a structural diagram of another display panel according to an embodiment of the present application.

FIG. 21 is a structural diagram of another display panel according to an embodiment of the present application. Referring to FIG. 21, in an embodiment of the present application, the pixel drive unit rows are uniformly arranged in the second direction D2.

FIG. 21 shows the solution in which the pixel drive unit rows are uniformly arranged along the second direction D2 when multiple (two or more) pixel drive unit rows are introduced into the display panel 100. The pixel drive unit rows are uniformly arranged along the second direction D2, which means that the distance between any two adjacent pixel drive unit rows along the second direction D2 is the same. Adopting such a setting method is conducive to ensuring the arrangement uniformity of the pixel driving circuits in the display panel 100 and preventing the user experience from being affected by the uneven black states when the display region AA is off due to the uneven arrangement of the pixel driving circuits. In addition, the uniform arrangement of the pixel drive unit rows is conducive to simplifying the manufacturing process of the pixel driving circuits and improving the overall production efficiency of the display panel 100.

The relative positional relationship between the pixel driving circuits and the light-emitting elements shown in the embodiment of FIGS. 20 and 21 is only for illustration. For example, in the first display region AA1, the pixel driving circuits and the light-emitting elements P in the thickness direction of the display panel 100 may be embodied as an overlapping structure as shown in FIG. 21, so as to rationally utilize the space of the display region AA. When the pixel driving circuits and the light-emitting elements P overlap, since the pixel driving circuits are located on a side of the light-emitting elements P facing the substrate, the light emission of the light-emitting elements P is not affected.

Figure 22:
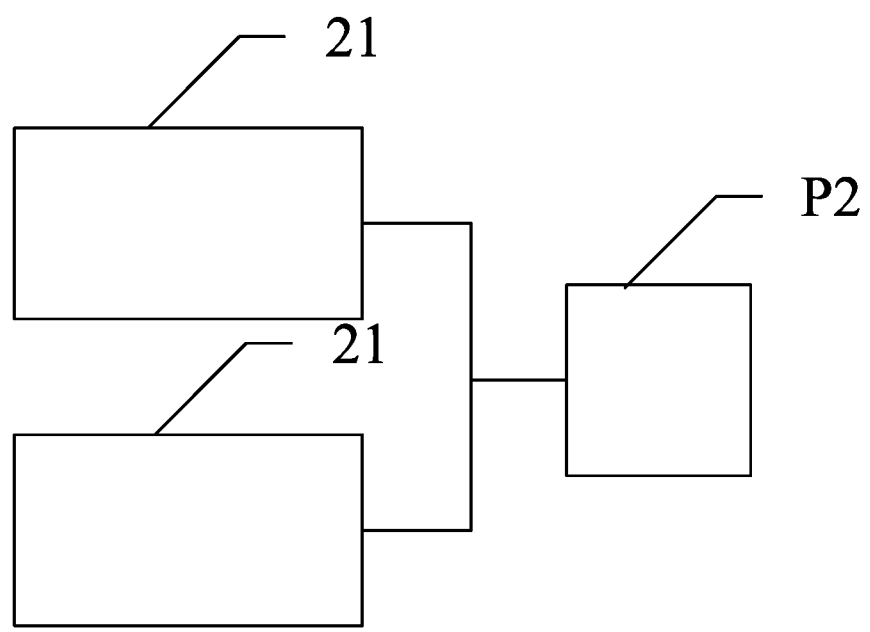
FIG. 22 is a schematic diagram illustrating the connection between at least two first pixel driving circuits and the same second light-emitting element in a display panel according to an embodiment of the present application.

FIG. 22 is a schematic diagram illustrating the connection between at least two first pixel driving circuits and the same second light-emitting element in a display panel according to an embodiment of the present application. In an embodiment of the present application, at least two first pixel driving circuits 21 are electrically connected to the same second light-emitting element P2. At least two first pixel driving circuits 21 are used to drive the same second light-emitting element P2, which is conducive to improving the capability of driving the second light-emitting element P2 and improving the light emission reliability of the second light-emitting element P2. In addition, when one of the first pixel driving circuits 21 connected to the same second light-emitting element P2 is in an abnormal working state, the other first pixel driving circuit 21 can drive the second light-emitting element P2 normally, which is conducive to ensuring the light emission reliability of the second light-emitting element P2.

FIG. 22 only illustrates the solution in which one second light-emitting element P2 is connected to two first pixel driving circuits 21 as an example and does not limit the number of the first pixel driving circuits 21 actually connected to the same second light-emitting element P2. In some other embodiments of the present application, three or more first pixel driving circuits 21 may be connected to the same second light-emitting element P2.

Figure 23:
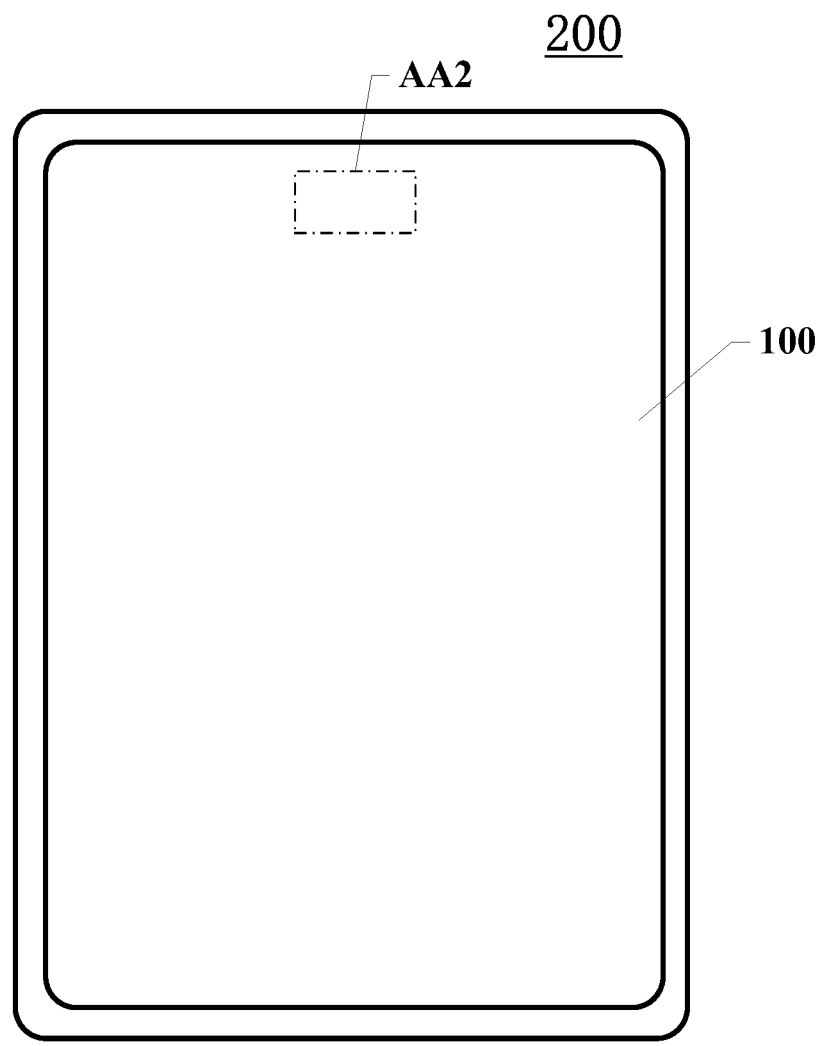
FIG. 23 is a structural diagram of a display device according to an embodiment of the present application.

Based on the same concept, the present application further provides a display device. FIG. 23 is a structural diagram of a display device according to an embodiment of the present application. A display device 200 includes the display panel 100 provided in any of the preceding embodiments of the present application. In an embodiment, the display device 200 further includes photosensitive elements disposed in the optical component region AA2, such as a camera, an infrared sensor, a fingerprint recognition device, and other electronic photosensitive devices.

The display device 200 provided in the embodiment of the present application may be a computer, a television, an in-vehicle display device, and other display devices with a display function, which is not limited in the present application. The display device 200 provided in the embodiment of the present application has the effects of the display panel 100 provided in the embodiments of the present application. Reference may be made to the description of the display panel 100 in the preceding embodiments. The details are not repeated here in this embodiment.

To sum up, the display panel and the display device provided in the present application achieve at least the effects described below.

In the display panel and the display device provided in the embodiments of the present application, the first display region and the optical component region are provided. In an embodiment, the first display region at least partially surrounds the optical component region, and the camera, the infrared sensor, the fingerprint recognition device, and other electronic photosensitive devices are disposed in the optical component region. The first light-emitting elements are disposed in the first display region, and the second light-emitting elements are disposed in the optical component region. In the display stage, both the optical component region and the first display region implement a display function, and the second light-emitting elements of the optical component region are driven by the first pixel driving circuits to emit light; in the photosensitive stage, the optical component region is used as the light-transmissive region to implement a photosensitive function, and the second light-emitting elements of the optical component region do not emit light at this time. In particular, in the present application, the first pixel driving circuits configured to drive the second light-emitting elements of the optical component region to emit light are disposed in the first pixel drive unit column in the first display region, and the first pixel driving circuits are not disposed in the optical component region, so as to avoid the influence of the first pixel driving circuits on the light transmittance of the optical component region, which is conducive to improving the photosensitive performance of the optical component region in the photosensitive stage. In addition, for the second light-emitting elements in the optical component region and the first pixel driving circuits in the first display region, one first pixel driving circuit drives one second light-emitting element to emit light. Compared with the solution in the related art that one pixel driving circuit drives two or more second light-emitting elements to emit light, the present application is more conducive to improving the display effect of the optical component region in the display stage, reducing the display brightness difference between the optical component region and the first display region, improving the overall display effect of the display panel and the display device, and improving the display quality.

What is claimed is:
1. A display panel, comprising:
a display region comprising a first display region and an optical component region; and
light-emitting elements comprising first light-emitting elements and second light-emitting elements, wherein the first light-emitting elements are located in the first display region, and the second light-emitting elements are located in the optical component region;
wherein the first display region comprises a plurality of pixel drive unit columns arranged along a first direction, the plurality of pixel drive unit columns comprise a first pixel drive unit column, the first pixel drive unit column comprises a plurality of first pixel driving circuits, and one of the plurality of first pixel driving circuits is electrically connected to one of the second light-emitting elements;
wherein the plurality of pixel drive unit columns further comprise a second pixel drive unit column located in the first display region, the second pixel drive unit column comprises a plurality of second pixel driving circuits, and the plurality of second pixel driving circuits are electrically connected to the first light-emitting elements;
the second pixel drive unit column comprises a first sub-second pixel drive unit column, the display panel further comprises a first non-display region, and the first sub-second pixel drive unit column is located between the first non-display region and the optical component region along a second direction, wherein the second direction intersects with the first direction; and
the first display region further comprises a plurality of data signal lines, the plurality of data signal lines comprise a first data signal line and a second data signal line, the first data signal line is electrically connected to the plurality of first pixel driving circuits, the second data signal line is electrically connected to the plurality of second pixel driving circuits in the first sub-second pixel drive unit column, and the first data signal line is electrically connected to the second data signal line;
wherein the first data signal line and the second data signal line are electrically connected in the first non-display region through a first connecting portion and connected in the display region through a second connecting portion;
wherein the first display region comprises a first signal line extending along the first direction, and the second connecting portion overlaps the first signal line in a thickness direction of the display panel.

2. The display panel of claim 1, wherein the first pixel drive unit column further comprises a plurality of first dummy pixel driving circuits.

3. The display panel of claim 2, wherein in the first pixel drive unit column, at least one of the plurality of first pixel driving circuits and at least one of the plurality of first dummy pixel driving circuits are arranged alternately.

4. The display panel of claim 2, wherein in the first pixel drive unit column, the plurality of first pixel driving circuits and the plurality of first dummy pixel driving circuits are concentrated separately.

5. The display panel of claim 2, wherein the first display region further comprises a first dummy data signal line electrically connected to the plurality of first dummy pixel driving circuits, and the first dummy data signal line is configured to be electrically connected to a fixed voltage signal terminal.

6. The display panel of claim 2, wherein the plurality of first dummy pixel driving circuits are reused as repairing pixel driving circuits.

7. The display panel of claim 1, wherein a light-emitting element density of the optical component region is the same as a light-emitting element density of the first display region.

8. The display panel of claim 1, wherein in the display panel, a total number of pixel driving circuits is greater than a total number of the light-emitting elements.

9. The display panel of claim 1, wherein along the first direction, at least part of the plurality of first pixel driving circuits in the first pixel drive unit column overlap the optical component region.

10. The display panel of claim 1, wherein
the plurality of pixel drive unit columns are uniformly arranged in the first direction.

11. The display panel of claim 1, wherein the plurality of pixel drive unit columns comprise a third pixel drive unit column, and the third pixel drive unit column comprises a plurality of second dummy pixel driving circuits; and
the third pixel drive unit column is located between the first non-display region and the optical component region along the second direction.

12. The display panel of claim 11, wherein the first display region further comprises a second dummy data signal line electrically connected to the plurality of second dummy pixel driving circuits, and the second dummy data signal line is configured to be electrically connected to a fixed voltage signal terminal.

13. The display panel of claim 1, wherein
the first display region further comprises a plurality of pixel drive unit rows arranged along the second direction, the plurality of pixel drive unit rows comprise a first pixel drive unit row and a second pixel drive unit row, the first pixel drive unit row comprises the plurality of second pixel driving circuits arranged continuously, the second pixel drive unit row comprises a plurality of third dummy pixel driving circuits arranged continuously, one of the plurality of first pixel driving circuits is electrically connected to one of the second light-emitting elements through a third connecting portion, and the third connecting portion overlaps the second pixel drive unit row in a thickness direction of the display panel.

14. The display panel of claim 13, wherein the plurality of pixel drive unit rows are uniformly arranged in the second direction.

15. The display panel of claim 1, wherein at least two of the plurality of first pixel driving circuits are electrically connected to a same one of the second light-emitting elements.

16. A display device, comprising a display panel
wherein the display panel comprises:
a display region comprising a first display region and an optical component region; and
light-emitting elements comprising first light-emitting elements and second light-emitting elements, wherein the first light-emitting elements are located in the first display region, and the second light-emitting elements are located in the optical component region;
wherein the first display region comprises a plurality of pixel drive unit columns arranged along a first direction, the plurality of pixel drive unit columns comprise a first pixel drive unit column, the first pixel drive unit column comprises a plurality of first pixel driving circuits, and one of the plurality of first pixel driving circuits is electrically connected to one of the second light-emitting elements;
wherein the plurality of pixel drive unit columns further comprise a second pixel drive unit column located in the first display region, the second pixel drive unit column comprises a plurality of second pixel driving circuits, and the plurality of second pixel driving circuits are electrically connected to the first light-emitting elements;
the second pixel drive unit column comprises a first sub-second pixel drive unit column, the display panel further comprises a first non-display region, and the first sub-second pixel drive unit column is located between the first non-display region and the optical component region along a second direction, wherein the second direction intersects with the first direction; and
the first display region further comprises a plurality of data signal lines, the plurality of data signal lines comprise a first data signal line and a second data signal line, the first data signal line is electrically connected to the plurality of first pixel driving circuits, the second data signal line is electrically connected to the plurality of second pixel driving circuits in the first sub-second pixel drive unit column, and the first data signal line is electrically connected to the second data signal line;
wherein the first data signal line and the second data signal line are electrically connected in the first non-display region through a first connecting portion and connected in the display region through a second connecting portion;
wherein the first display region comprises a first signal line extending along the first direction, and the second connecting portion overlaps the first signal line in a thickness direction of the display panel.

17. The display device according to claim 16, wherein the first pixel drive unit column further comprises a plurality of first dummy pixel driving circuits.

18. The display device according to claim 17, wherein in the first pixel drive unit column, at least one of the plurality of first pixel driving circuits and at least one of the plurality of first dummy pixel driving circuits are arranged alternately.

19. The display device according to claim 17, wherein in the first pixel drive unit column, the plurality of first pixel driving circuits and the plurality of first dummy pixel driving circuits are concentrated separately.

20. The display device according to claim 17, wherein the first display region further comprises a first dummy data signal line electrically connected to the plurality of first dummy pixel driving circuits, and the first dummy data signal line is configured to be electrically connected to a fixed voltage signal terminal.

* * * * *